(12) United States Patent
Nishizawa et al.

(10) Patent No.: US 7,303,138 B2
(45) Date of Patent: *Dec. 4, 2007

(54) INTEGRATED CIRCUIT CARD HAVING STAGGERED SEQUENCES OF CONNECTOR TERMINALS

(75) Inventors: Hirotaka Nishizawa, Fuchu (JP);
Haruji Ishihara, Kawaguchi (JP);
Atsushi Shiraishi, Kodaira (JP);
Kouichi Kanemoto, Koganei (JP);
Yousuke Yukawa, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/378,275

(22) Filed: Mar. 20, 2006

(65) Prior Publication Data

US 2006/0157572 A1    Jul. 20, 2006

Related U.S. Application Data

(60) Continuation of application No. 10/988,622, filed on Nov. 16, 2004, now Pat. No. 7,048,197, which is a continuation of application No. 10/693,887, filed on Oct. 28, 2003, now abandoned, which is a division of application No. 09/756,867, filed on Jan. 10, 2001, now Pat. No. 6,945,465.

(30) Foreign Application Priority Data

Jan. 25, 2000    (JP) ............................. 2000-018030

(51) Int. Cl.
*G06K 19/06* (2006.01)

(52) U.S. Cl. ....................................... 235/492; 439/60

(58) Field of Classification Search ................ 235/492, 235/441; 257/679; 174/255; 439/630, 180, 439/60; 340/7.32; 361/42, 764, 763, 822, 361/737; 902/25, 26
See application file for complete search history.

(56) References Cited

U.S. PATENT DOCUMENTS 4,532,419 A    7/1985    Takeda .................... 235/492

(Continued)

FOREIGN PATENT DOCUMENTS

DE    199 15 766    2/2000

(Continued)

OTHER PUBLICATIONS

"The MultiMediaCard", The MultiMediaCard System, Summary Version 2.2, Jan. 2000, MMCA.

*Primary Examiner*—Jared J. Fureman
(74) *Attorney, Agent, or Firm*—Miles & Stockbridge P.C.

(57) ABSTRACT

An IC card has a card substrate having semiconductor integrated circuit chips mounted thereon and a plurality of connector terminals formed thereon. The connector terminals are exposed from a casing. The connector terminals are laid out in plural sequences in staggered form between sequences adjacent to one another forward and backward as viewed in an IC card inserting direction. Owing to the adoption of the staggered layout, a structure or configuration wherein the amounts of protrusions of socket terminals of a card socket are changed and the socket terminals are laid out in tandem, can be adopted with relative ease. If a connector terminal arrangement of a downward or low-order IC card is adopted as a specific connector terminal sequence as it is, whereas a function dedicated for an upward or high-order IC card is assigned to another staggered connector terminal arrangement, then backward compatibility can also be implemented with ease.

20 Claims, 27 Drawing Sheets

U.S. PATENT DOCUMENTS

| | | | |
|---|---|---|---|
| 4,695,914 A | 9/1987 | Ohtsuki et al. | 361/42 |
| 4,780,603 A | 10/1988 | Hamada | 235/492 |
| 4,794,243 A | 12/1988 | Hamada | 235/492 |
| 4,816,656 A | 3/1989 | Nakano et al. | 235/492 |
| 4,962,415 A | 10/1990 | Yamamoto et al. | 257/679 |
| 5,126,548 A | 6/1992 | Sekiguchi | 235/492 |
| 5,204,512 A | 4/1993 | Ieki et al. | 235/492 |
| 5,285,057 A | 2/1994 | Murohara | 235/492 |
| 5,426,566 A | 6/1995 | Beilstein et al. | 361/735 |
| 5,550,709 A | 8/1996 | Iwasaki | 235/492 |
| 5,561,628 A | 10/1996 | Terada et al. | 361/185.04 |
| 5,815,426 A | 9/1998 | Jigour et al. | 365/51 |
| 5,969,951 A | 10/1999 | Fischer et al. | 361/737 |
| 5,999,409 A | 12/1999 | Ando et al. | 361/737 |
| 6,002,177 A | 12/1999 | Gaynes et al. | 257/774 |
| 6,040,622 A | 3/2000 | Wallace | 257/679 |
| 6,142,802 A | 11/2000 | Berg et al. | 439/180 |
| 6,157,316 A | 12/2000 | Okayama et al. | 340/825.44 |
| 6,431,456 B2 | 8/2002 | Nishizawa et al. | 235/492 |
| 6,483,038 B2 | 11/2002 | Lee et al. | 174/255 |
| 6,492,717 B1 | 12/2002 | Gore et al. | 257/679 |
| 6,527,590 B2 | 3/2003 | Oguchi | 439/630 |
| 6,538,331 B2 | 3/2003 | Masuda et al. | 257/777 |
| 6,552,423 B2 | 4/2003 | Song et al. | 257/679 |
| 6,573,567 B1 | 6/2003 | Nishizawa et al. | 361/737 |
| 6,607,135 B1 | 8/2003 | Hirai et al. | 235/492 |
| 6,642,611 B2 | 11/2003 | Iwasaki | 257/679 |
| 6,686,663 B2 | 2/2004 | Masuda et al. | 257/777 |
| 6,945,465 B2 * | 9/2005 | Nishizawa et al. | 235/492 |
| 2003/0112611 A1 | 6/2003 | Nishizawa et al. | 361/763 |
| 2003/0112613 A1 | 6/2003 | Nishizawa et al. | 361/764 |
| 2004/0056104 A1 | 3/2004 | Osawa et al. | 235/492 |

FOREIGN PATENT DOCUMENTS

| | | |
|---|---|---|
| JP | 62-5367 | 1/1987 |
| JP | 63-6872 | 1/1988 |
| JP | 63-7981 | 1/1988 |
| JP | 63-9586 | 1/1988 |
| JP | 1-263094 | 10/1989 |
| JP | 4-152193 | 5/1992 |
| JP | 8-171623 | 7/1996 |
| JP | 9-17511 | 1/1997 |
| JP | 9-204507 | 8/1997 |
| JP | 11-273400 | 10/1999 |
| JP | 2000-214970 | 8/2000 |
| JP | 1090240 | 11/2000 |
| JP | 2001-67303 | 3/2001 |
| JP | 1115151 | 7/2001 |
| JP | 2001-513245 | 8/2001 |

* cited by examiner

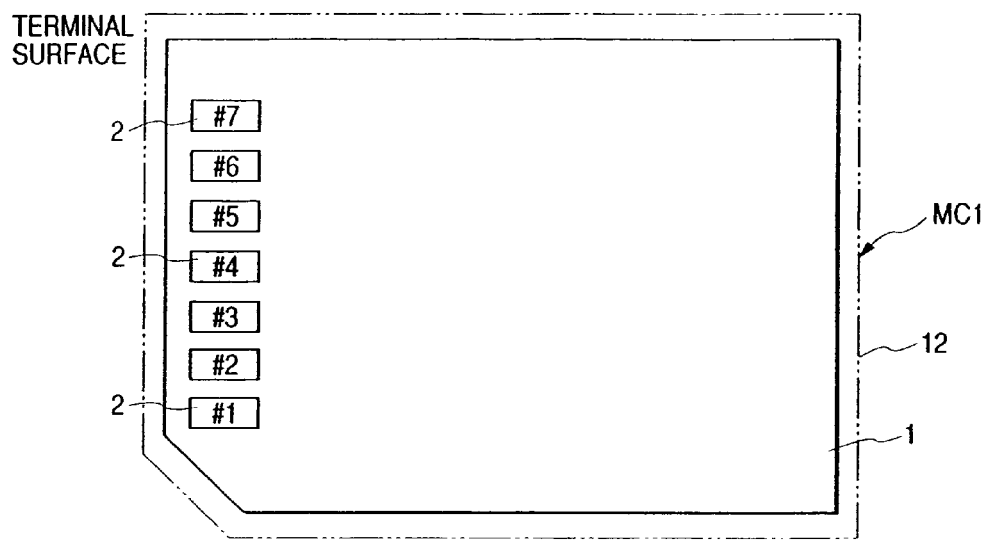
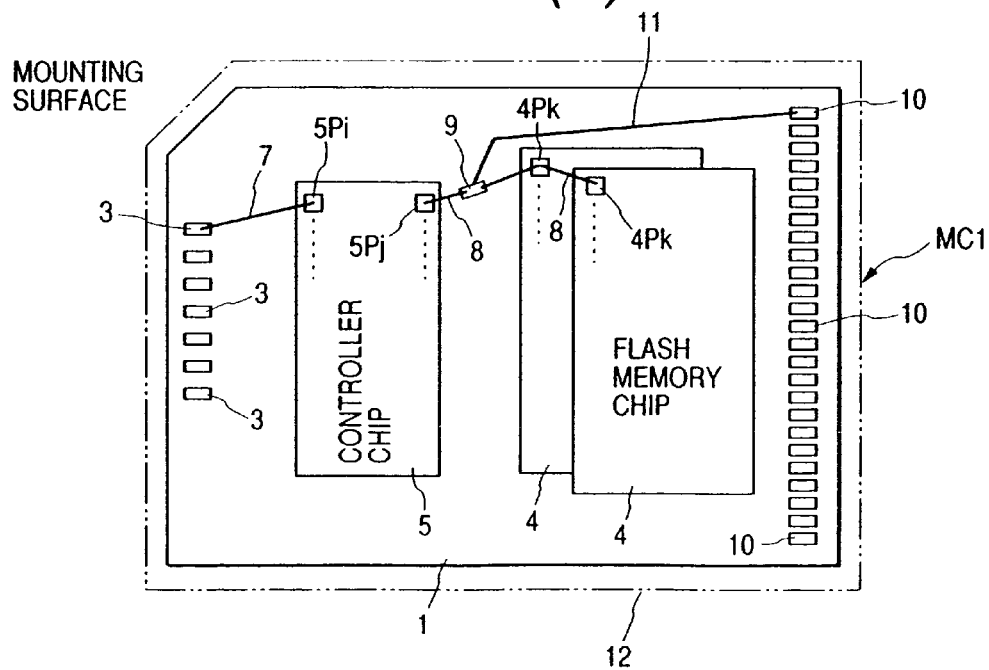

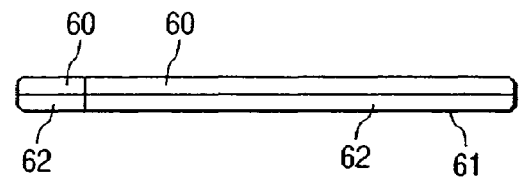
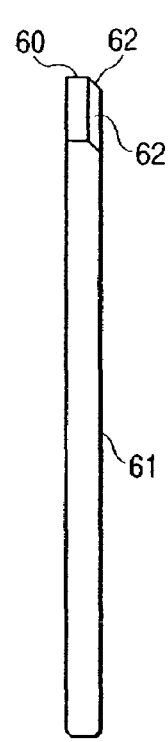
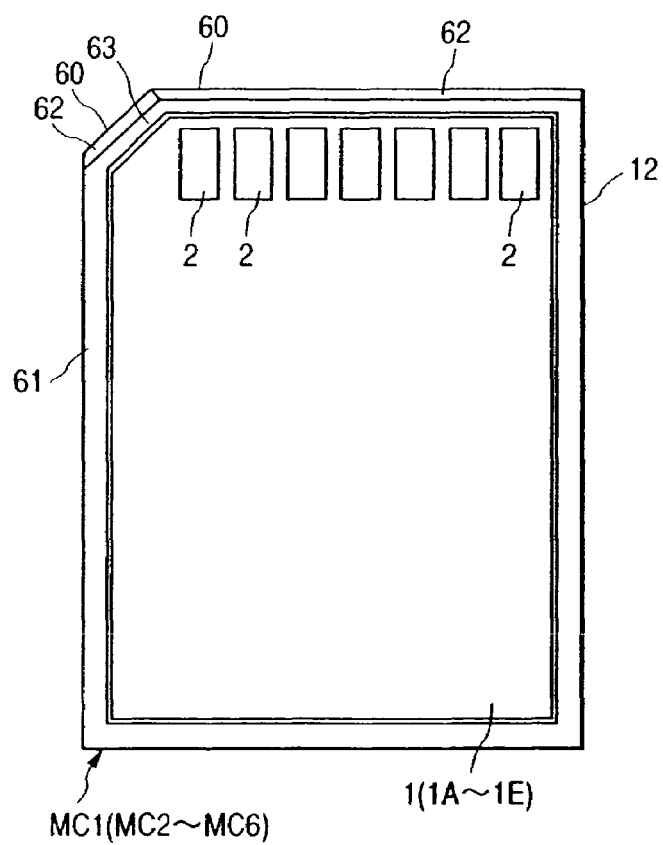

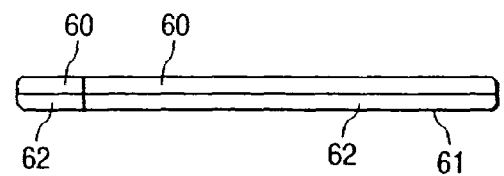
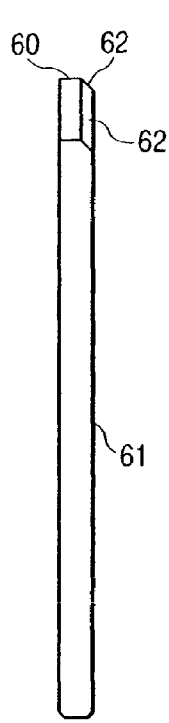
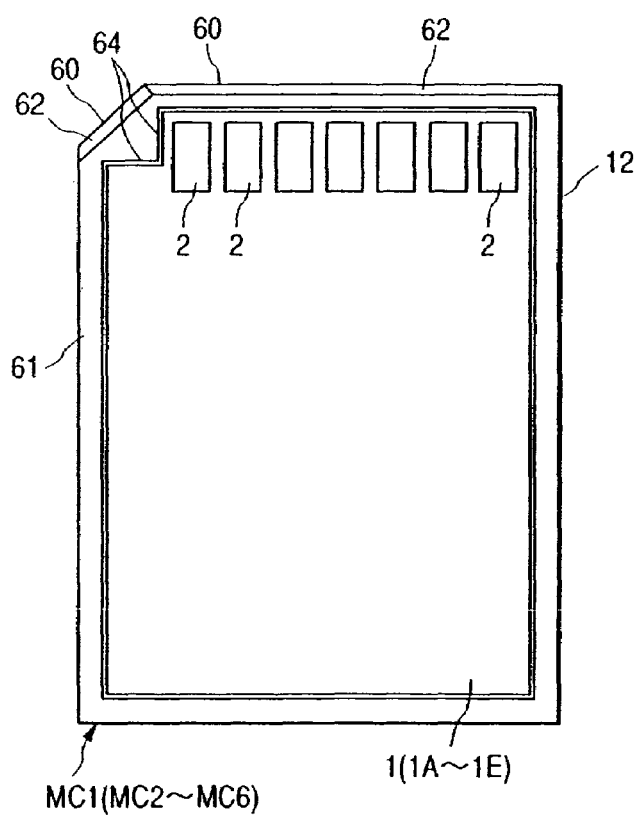

FIG. 30
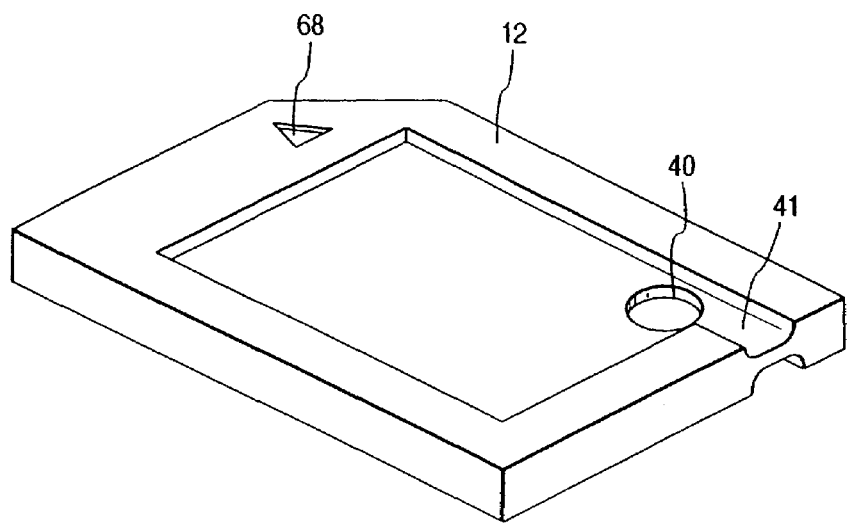
FIG. 31(B)          FIG. 31(A)
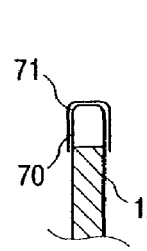   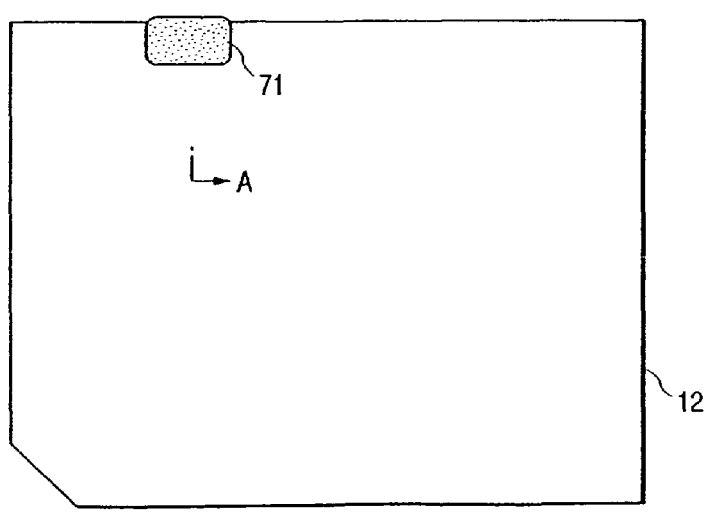

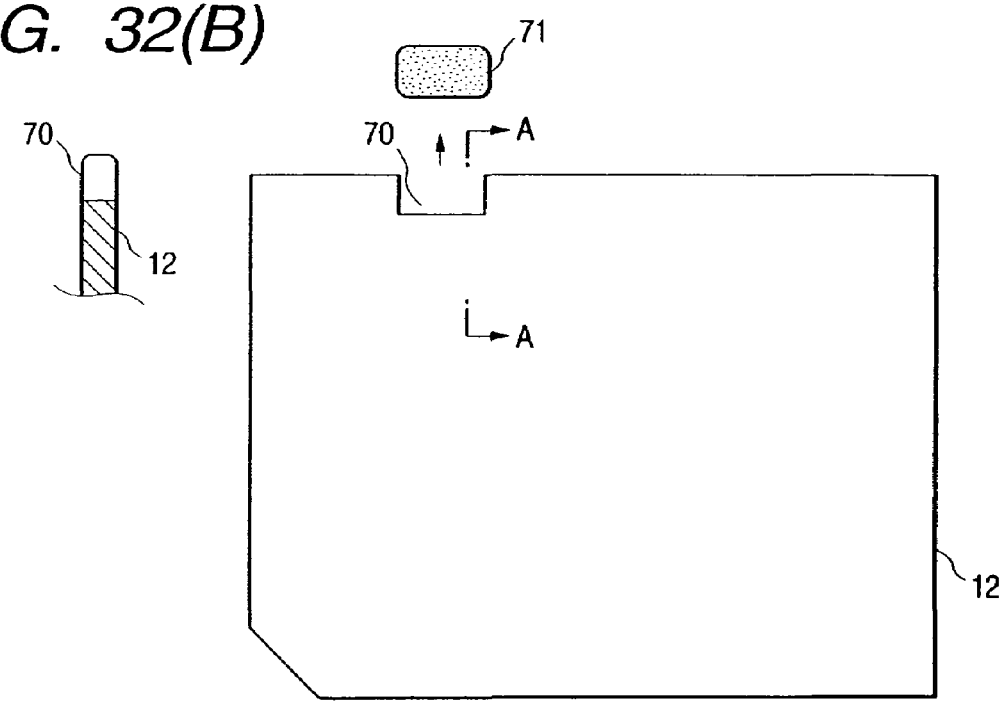

FIG. 33(B)  FIG. 33(A)
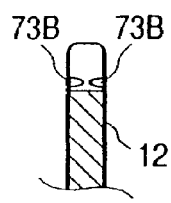
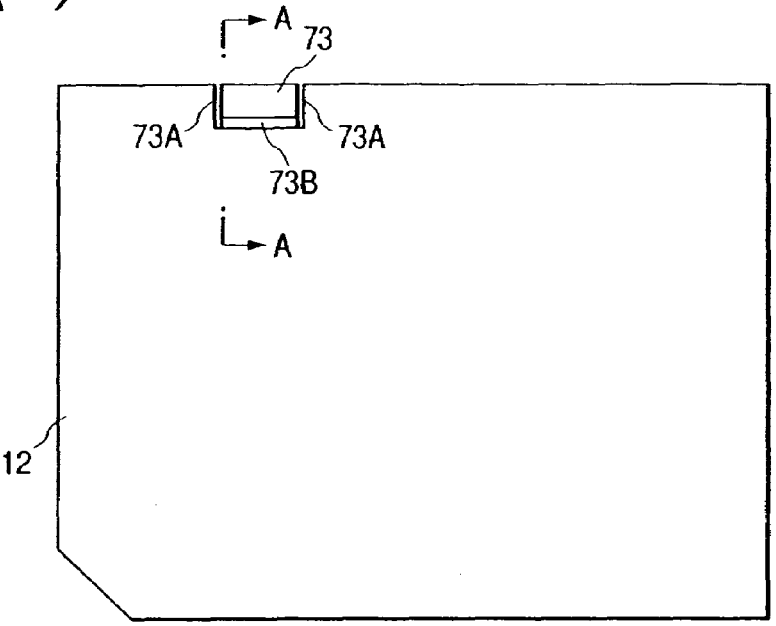
FIG. 34(B)  FIG. 34(A)
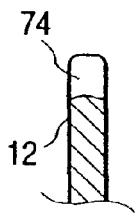
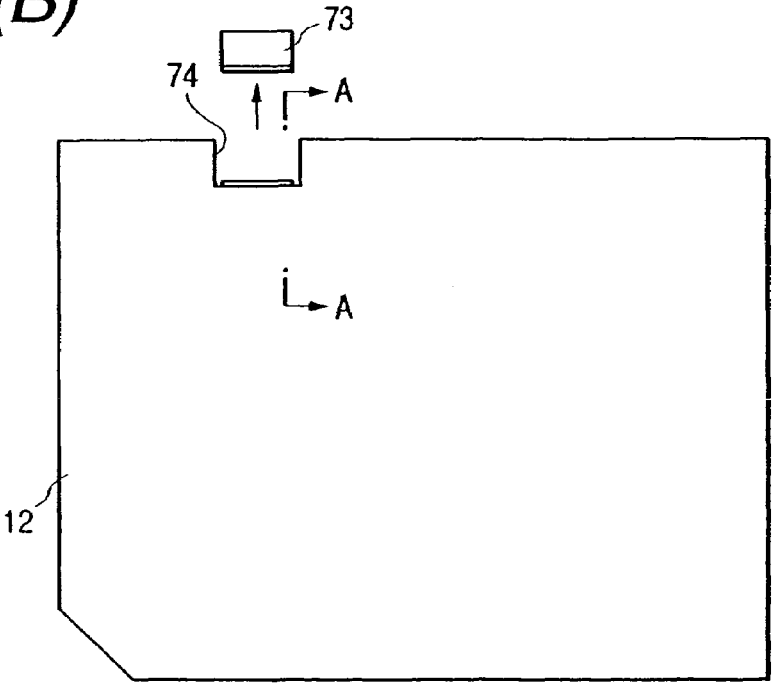

INTEGRATED CIRCUIT CARD HAVING STAGGERED SEQUENCES OF CONNECTOR TERMINALS

CROSS-REFERENCE TO RELATED APPLICATION

This application is a continuation of application Ser. No. 10/988,622 filed Nov. 16, 2004, now U.S. Pat. No. 7,048,197, which is a continuation of application Ser. No. 10/693,887 filed Oct. 28, 2003, now abandoned, which is a division of application Ser. No. 09/756,867 filed Jan. 10, 2001, now U.S. Pat. No. 6,945,465.

BACKGROUND OF THE INVENTION

The present invention relates to a technology for improving compatibility related to an arrangement and functions of connector terminals for an IC card, and utilizability and reliability of an IC card, and related to, for example, a technology effective for application to a compatible memory card such as a multi media card (Multi Media Card).

There has been provided a memory card having implemented reductions in size and weight and the simplification of an interface, such as a multi media card or the like aimed to perform, for example, the transfer of information between cellular phone and digital network device. As described in, for example, the System Summary issued from the Multi Media Card Association, the multi media card has seven connector terminals as external interface terminals and adopts a serial interface. As compared with an ATA interface adopted by a PC card or hard disk, it can lighten a load on a host system and can be used even in a simpler system.

Further, an SD card has been proposed as an upward compatible memory card like a multi media card, which adopts a serial interface and has nine connector terminals.

SUMMARY OF THE INVENTION

The present inventors have carried out various discussions about compatibility, function expansion, an improvement in reliability, etc. with respect to a multi media card.

The shapes and layout of connector terminals for a multi media card or the like have firstly been discussed. A point of difference between interface specifications of each individual memory cards is reflected on the shapes and layout of the connector terminals of the card. Further, the point of difference is reflected on each socket terminal of a card socket. Thus, it has been revealed by the present inventors that if there is no commonality between arrangements and shapes of connector terminals even if there is consistency between the size and thickness of each casing, it is difficult to implement compatibility and upward compatibility among the memory cards.

It is secondly estimated that a serial interface is not capable of obtaining a data input/output rate necessary for data processing as compared with the PC card or compact flash card or the like which adopts the ATA interface. In order to cope with it, the number of connector terminals for data input/output must be increased. At that time, the compatibility should be taken into consideration from the above point of view.

Thirdly, the present inventors have found out the need for contrivances for avoiding the occurrence of a power-to-power short in any relative position between connector terminals of an IC card and socket terminals of a card socket when the IC card is inserted into the card socket, where it is desired to increase the number of the connector terminals while the size of the IC card remains unchanged.

Fourthly, an IC card which is small and thin as compared with a PC card needs a contrivance in which forms such as storage of the IC card, carrying thereof, its shipment, etc. are taken into consideration.

Fifthly, a thin memory card such as a multi media card is hard to obtain a space for adopting a mechanical shutter mechanism for selectively exposing connector terminals. Thus, there is a possibility that when a finger or the like directly touches the connector terminals upon detachment and carrying of the multi media card, electrostatic discharge damage will occur according to a surge exceeding resistance to ESD protection of an mounted semiconductor integrated circuit chip. The multi media card is expected to be singly carried or often detached from a host device. Thus, the present inventors have found out the utility for the enhancement of prevention of the electrostatic discharge damage.

Sixthly, consideration taken to avoid the compaction of wiring patterns and that of bonding wires so as not to cause malfunctions due to an undesired leak on a signal line since a free space on a card substrate is reduced due to an improvement in the function of an IC card and an increase in the number of connector terminals, leads to an improvement in the reliability of the IC card.

An object of the present invention is to improve usability and reliability of an IC card.

Another object of the present invention is to provide an IC card which is easy to implement compatibility related to an arrangement and functions of connector terminals.

A further object of the present invention is to provide an IC card which is hard to cause a power-to-power short upon loading in a card socket.

A still further object of the present invention is to provide an IC card which is capable of avoiding compaction of wiring patterns and that of bonding wires.

A still further object of the present invention is to provide an IC card which is capable of blocking the inflow of surges from connector terminals by a simple structure.

The above, other objects and novel features of the present invention will become apparent from the description of the present specification and the accompanying drawings.

Summaries of typical ones of the inventions disclosed in the present application will be explained in brief as follows:

When it is desired to add data terminals or the like to specific specifications of a connector terminal arrangement and implement upward compatibility, an arrangement of connector terminals needs to make allowance for making it possible to support or cope with even downward compatibility (e.g., compatibility that a high-order or upward IC card can be utilized by being inserted into a socket of a low-order or downward IC card) together with upward compatibility (e.g., compatibility that a low-order or downward IC card can be utilized by being inserted into a card socket of a high-order or upward IC card) having specifications related to the high-order IC card.

An IC card based on the above point of view has a card substrate having at least one semiconductor integrated circuit chip mounted thereon and a plurality of connector terminals formed thereon. The connector terminals are exposed from a casing. The connector terminals are laid out in plural sequences in staggered form between the sequences adjacent to one another forward and backward as viewed in an IC card inserting direction.

If another expression is made to the staggered layout, then the connector terminals include an arrangement of two rows or sequences formed back and forth as viewed in an IC card inserting direction. Further, an arrangement of terminal-to-terminal areas of connector terminals laid out in a first sequence and an arrangement of terminal-to-terminal areas of connector terminals laid out in a second sequence are shifted from each other as viewed in a sequence direction.

If a further expression is made to the staggered layout, then the connector terminals include an arrangement of two sequences formed back and forth as viewed in an IC card inserting direction. Further, a sequence-directional layout of connector terminals laid out in a first sequence and a sequence-directional layout of connector terminals laid out in a second sequence are shifted from each other as viewed in a sequence direction.

Owing to the adoption of a plural-sequence layout of a form typified by staggered fashion, a structure or configuration wherein the amounts of protrusions of socket terminals of a card socket are changed and the socket terminals are laid out in tandem, can be adopted with relative ease for the arrangement of the connector terminals. If a connector terminal arrangement of a downward or low-order IC card is adopted as a specific connector terminal sequence as it is, whereas a function dedicated for an upward or high-order IC card is assigned to another staggered connector terminal arrangement, then such backward compatibility that the upward IC card can be utilized by being mounted in a card slot of the downward IC card, can also be implemented with ease.

It is assumed that when it is desired to make a plan to achieve compatibility among three generations or later or between three types or more of IC cards, an arrangement of connector terminals of a first IC card is adopted as a connector terminal sequence corresponding to a first sequence as it is, whereas a function dedicated for a second IC card is assigned to a connector terminal sequence corresponding to another staggered second sequence, and a function dedicated for a third IC card is assigned to both the specific terminal sequence corresponding to the first sequence and the connector terminal sequence corresponding to the second sequence. At this time, consideration is given to the implementation of upward compatibility and downward compatibility between the second IC card and the third IC card. To this end, a configuration is adopted wherein the connector terminal at one end extending in a sequence direction, of the connector terminals laid out in the second sequence extends to a position where it adjoins the connector terminal as viewed in a sequence direction, at one end extending in the sequence direction, of the connector terminals laid out in the first sequence, and the connector terminal at the other end extending in the sequence direction, of the connector terminals laid out in the second sequence extends to a position where it adjoins the connector terminal as viewed in the sequence direction, at the other end extending in the sequence direction, of the connector terminals laid out in the first sequence.

According to it, the first through third IC cards are capable of easily implementing compatibility mutually available even to a slot of any of other IC cards by being inserted therein.

If consideration is given to a multi media card or the like at the present situation while specific functions of the connector terminals are optional, then the connector terminals may include one source voltage supply terminal, two ground voltage supply terminals, and one clock signal input terminal.

When consideration is given to an increase in a data input/output rate while a data terminal is one bit, the-multi media card may adopt, for example, a configuration in which data terminals corresponding to four bits are provided and the connector terminals are provided as nine in total, or a configuration wherein data terminals corresponding to eight bits are provided and the connector terminals are provided as thirteen in total.

When it is desired to implement compatibility with a memory card having a data terminal corresponding to one bit on the assumption of, for example, an IC card having the nine connector terminals referred to above, a configuration is considered in which the semiconductor chip has a controller chip connected to the connector terminals, and the controller chip has a one-bit mode using one bit of the data terminals of the four bits, the mode being set in response to the state of a predetermined connector terminal or the state of an input from the predetermined connector terminal, and a four-bit mode used to perform four-bit parallel input/output using the four-bit data terminals.

Similarly, when it is desired to implement compatibility with memory cards having data terminals corresponding to one bit and four bits under the assumption of an IC card having the thirteen connector terminals, the controller chip may be provided with a one-bit mode using one bit of the data terminals corresponding to the eight bits, the mode being set in response to the state of a predetermined connector terminal or the state of an input from the predetermined connector terminal, a four-bit mode which is used to perform four-bit parallel input/output using four bits of the eight-bit data terminals, and an eight-bit mode which is used to perform eight-bit parallel input/output using the data terminals corresponding to the eight bits.

Suppose a data processing system makes available any of an IC card having only the one-bit mode, an IC card having only the four-bit mode, and an IC card capable of selecting the one-bit mode and the four-bit mode. The data processing system has a card socket in which the IC card capable of selecting the one-bit mode and four-bit mode is applicable. The card socket includes a plurality of socket terminals respectively connected to connector terminals of the mounted IC card. Further, the data processing system has a card interface controller capable of selectively setting the one-bit mode or four-bit mode to the IC card through the socket terminals. The card interface controller is placed under the control of a host control device.

Suppose a data processing system makes available any of an IC card having only the one-bit mode, an IC card only the four-bit mode, an IC card having the eight-bit mode, an IC card capable of selecting the one-bit mode or four-bit mode, and an IC card capable of selecting the one-bit mode, four-bit mode or eight-bit mode. The data processing system has a card socket in which the IC card capable of selecting the one-bit mode, four-bit mode or eight-bit mode can be applicable. The card socket includes a plurality of socket terminals respectively connected to connector terminals of the mounted IC card. The data processing system has a card interface controller capable of selectively setting the one-bit mode, four-bit mode or eight-bit mode to the IC card through the socket terminals. The card interface controller is placed under the control of a host control device.

When supposing a memory card as the IC card, if a single or plural, e.g., electrically rewritable non-volatile memory chips connected to the controller chip are further provided as the semiconductor chips, then the controller chip has a memory control function for controlling a read/write operation with respect to the single or plural non-volatile memory chips in accordance with instructions given from outside. The non-volatile memory chip may be a ROM (Read Only Memory). Further, the non-volatile memory may be replaced with a RAM (Random Access Memory) according to uses.

If data security is taken into consideration, then the controller chip may further be provided with a security function for encoding data written into each non-volatile memory chip referred to above, and decoding the data read from the non-volatile memory chip.

When a connector terminal for the supply of a source voltage is placed in a connector terminal sequence corresponding to a first sequence as viewed in an IC card inserting direction, a terminal-to-terminal area is formed in a connector terminal sequence corresponding to a second sequence at positions adjacent to the connector terminal for the source voltage supply. There is a possibility that if other connector terminals adjacent to the connector terminal for the source voltage supply are placed in the connector terminal sequence corresponding to the second sequence in staggered form, then socket terminals of a card socket, which are assigned to other connector terminals, will make contact with both the source supply connector terminal and other connector terminals located ahead thereof before they reach other connector terminals. There is a possibility that if a source socket terminal is already in contact with the connector terminal for the source voltage supply in this state, then a power-to-power short will occur. If a structure or configuration is adopted in which the terminal-to-terminal areas are laid out, it is then unnecessary to take measures for increasing a sequence-to-sequence distance between the first sequence and second sequence of the connector terminals and narrowing the width of each connector terminal.

For the purposes similar to above, connector terminal for the source voltage supply in which broad terminal-to-terminal distance is set to portions where connector terminal for the source voltage supply faces a connector terminal sequence corresponding to a second sequence, may be provided in a connector terminal sequence corresponding to a first sequence as viewed in an IC card inserting direction.

When an IC card is inserted into its corresponding card socket, contacts of socket terminals are first brought into contact with a leading end of the IC card. Thus, there is a possibility that a leading end of a casing for the IC card will deform or crack with time. There is also a possibility that bending will occur in each socket terminal in reverse. In order to avoid it, a guide portion formed by a slant surface or circular arc extending from a leading edge portion extending at a front end in an IC card inserting direction to a connector terminal forming surface of the casing is formed in the casing for the IC card. The slant surface or circular arc of the guide portion is set larger than a slant surface or circular arc formed in each of other edge portions.

An IC card has a card substrate in which memory chips and a controller chip which controls the memory chip are mounted, and a plurality of connecting pads respectively conductive to a plurality of connector terminals are formed together with the connector terminals. A layout on the card substrate is set in order of the connector terminals, controller chip and memory chips with respect to one side of the card substrate. The connector terminals are exposed from a casing. The controller chip has a shape long along the direction of an arrangement of the connector terminals and includes a plurality of connector interface terminals connected to the connector terminals through the connecting pads on the connector terminal side, and a plurality of memory interface terminals connected to the corresponding memory chip on the memory chip side. Each memory chip referred to above has a plurality of controller interface terminals connected to the corresponding controller chip on the controller chip side.

According to the above, since the long controller chip is caused to approach the connector terminal side and each memory chip is placed on the side opposite to the controller chip, the area for laying out each memory chip can be made relatively large. Further, wirings for respectively connecting the connector terminals, the controller chip and each memory chip may be placed regularly in their arrangement directions. It is not necessary to adopt wirings which bypass each chip and are folded complicatedly.

The connecting pads may be electrically connected to their corresponding connector interface terminals of the controller chip through bonding wires. Further, the memory interface terminals of the controller chip may be connected to their corresponding controller interface terminals of each memory chip through bonding wires. According to it, each wiring layer of the card substrate can be simplified, thus making it possible to contribute to a cost reduction.

Through holes each of which extends through the front and back of a casing of each of relatively small and thin memory cards such as a multi media card, may be defined in the casing to improve the storage of the memory cards and their handling performance. It is easy to store and carry the IC card if a ring is put through the through holes. A strap may be drawn through its corresponding through hole.

A terminal protective cover which is pivoted about the through hole and covers the connector terminals in a state of being superimposed on the casing, may be provided. Since the protective cover is capable of restraining a situation that one touches the connector terminals carelessly, the prevention of electrostatic discharge damage of each semiconductor integrated circuit device mounted in an IC card can be enhanced from this point of view.

In order to make efficient tests about each post-mounting semiconductor integrated circuit chip, test terminals connected to the controller chip and the memory chips may be provided on the card substrate with the memory chips and controller chip mounted thereto. Since it is better to avoid ever-exposure of the test terminals after they have been assembled into their corresponding casing, the test terminals may be formed on the surface on the side opposite to the connector terminal forming surface of the card substrate from this point of view. If there is provided a control terminal for supplying a control signal for controlling each memory interface terminal of the controller chip to a high impedance state to the controller chip, then the memory chips can also be tested singly with ease using the test terminals.

Attribute information or the like about an IC card is normally displayed on the IC card as in the case of storage capacity or the like of a memory card. Applying a seal onto a casing may do such indication of information. However, when a reduction in the number of parts and the like are taken into consideration, required character information may be printed on the surface of the casing or concavely formed on the surface of the casing.

An indication mark indicative of the direction of insertion of an IC card into a card socket may be printed on the surface of the casing or concavely formed on the surface thereof.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 6(A) is an explanatory view illustrating the state of a terminal surface of a multi media card-based memory card;

FIG. 6(B) is an explanatory view showing the state of a mounting surface of the multi media card-based memory card;

FIG. 13 is an explanatory view depicting an example in which measures are taken to prevent a power-to-power short by virtue of linear dimensions of socket terminals or the like;

FIG. 26(A) is an explanatory view depicting a first example in which a casing of a memory card is provided with a guide portion;

FIG. 26(B) is an explanatory view showing the first example in which the casing of the memory card is provided with the guide portion;

FIG. 26(C) is an explanatory view showing the first example in which the casing of the memory card is provided with the guide-portion;

FIG. 27(A) is an explanatory view depicting a second example in which a casing of a memory card is provided with a guide portion;

FIG. 27(B) is an explanatory view illustrating the second example in which the casing of the memory card is provided with the guide portion;

FIG. 27(C) is an explanatory view showing the second example in which the casing of the memory card is provided with the guide portion;

FIG. 30 is a perspective view depicting an example of a memory card in which a concave portion is defined in a casing to represent an indication mark indicative of the direction of insertion of the memory card;

FIG. 31(A) is an explanatory view showing the state of release of write protect by a seal system;

FIG. 31(B) is an explanatory view illustrating the state of release of write protect by the seal system;

FIG. 32(A) is an explanatory view depicting the state of write protect by a seal system;

FIG. 32(B) is an explanatory view showing the state of write protect by the seal system;

FIG. 33(A) is an explanatory view illustrating the state of release of write protect by a lug system;

FIG. 33(B) is an explanatory view depicting the state of release of write protect by the lug system;

FIG. 34(A) is an explanatory view showing the state of write protect by a lug system;

FIG. 34(B) is an explanatory view illustrating the state of write protect by the lug system;

DESCRIPTION OF THE PREFERRED EMBODIMENTS

Figure 1A:
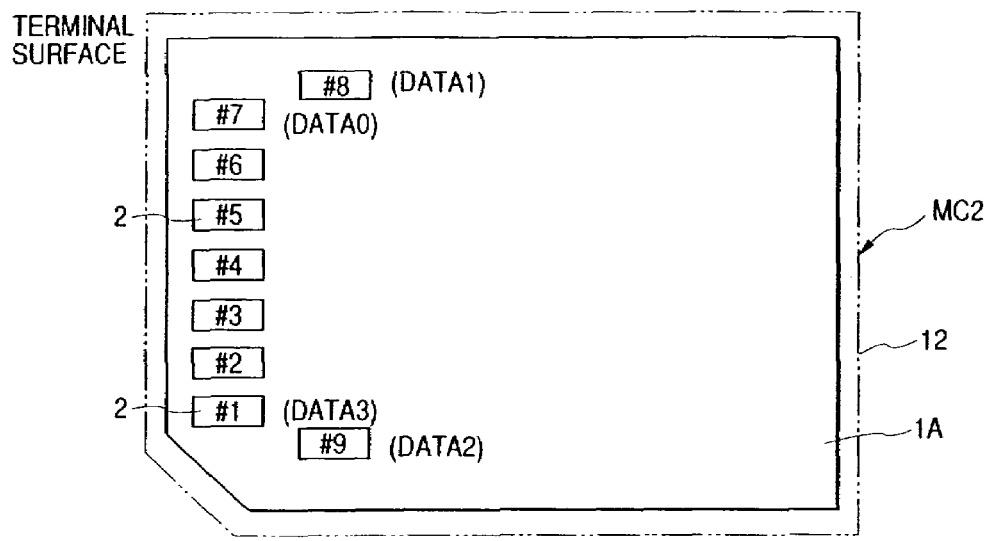
FIG. 1(A) is an explanatory view showing a terminal surface of an upward compatible memory card in which data terminals are set to four bits with respect to a multi media card.
Figure 1B:
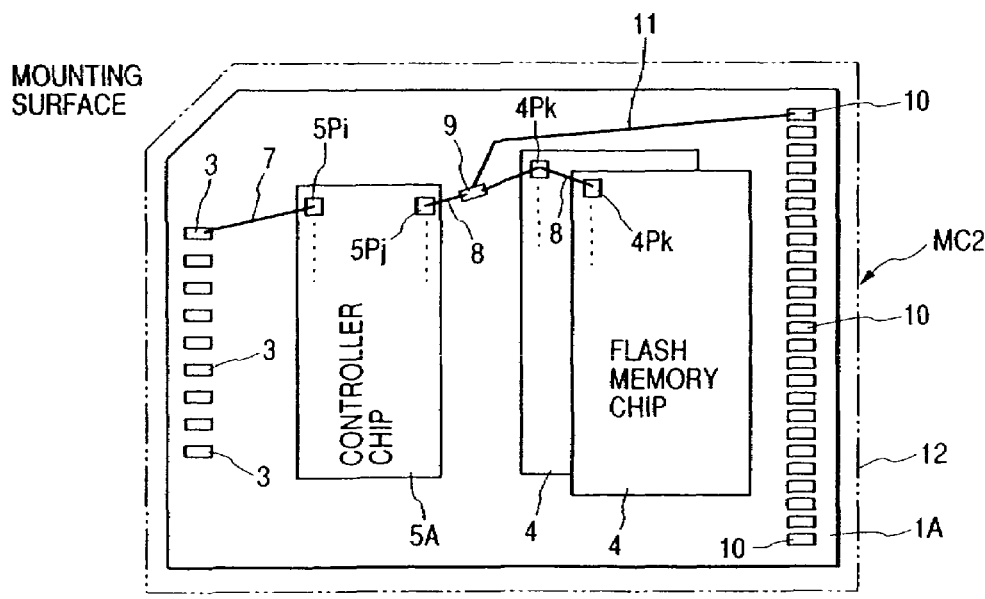
FIG. 1(B) is an explanatory view illustrating a mounting surface of the upward compatible memory card in which the data terminals are set to the four bits with respect to the multi media card.
Figure 2A:
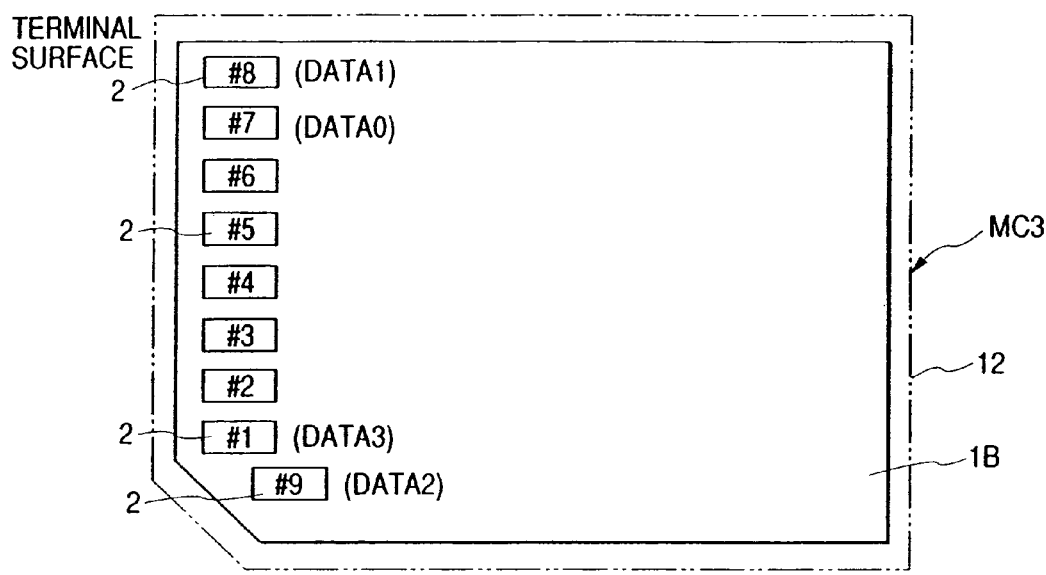
FIG. 2(A) is an explanatory view showing a terminal surface of another upward compatible memory card in which data terminals are set to four bits with respect to a multi media card.
Figure 2B:
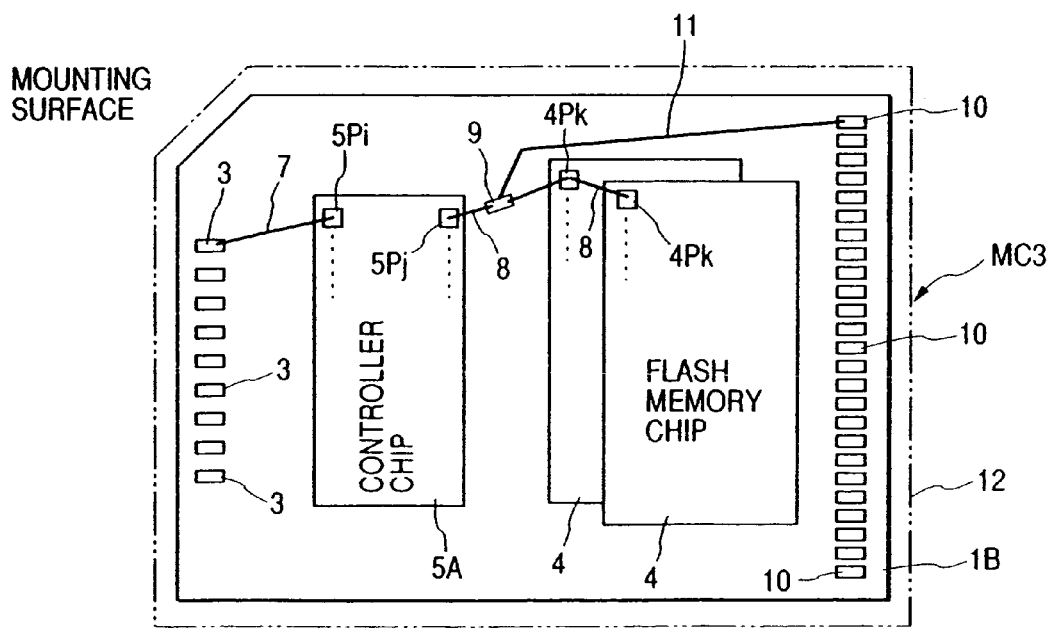
FIG. 2(B) is an explanatory view depicting a mounting surface of another upward compatible memory card in which the data terminals are set to the four bits with respect to the multi media card.
Figure 3A:
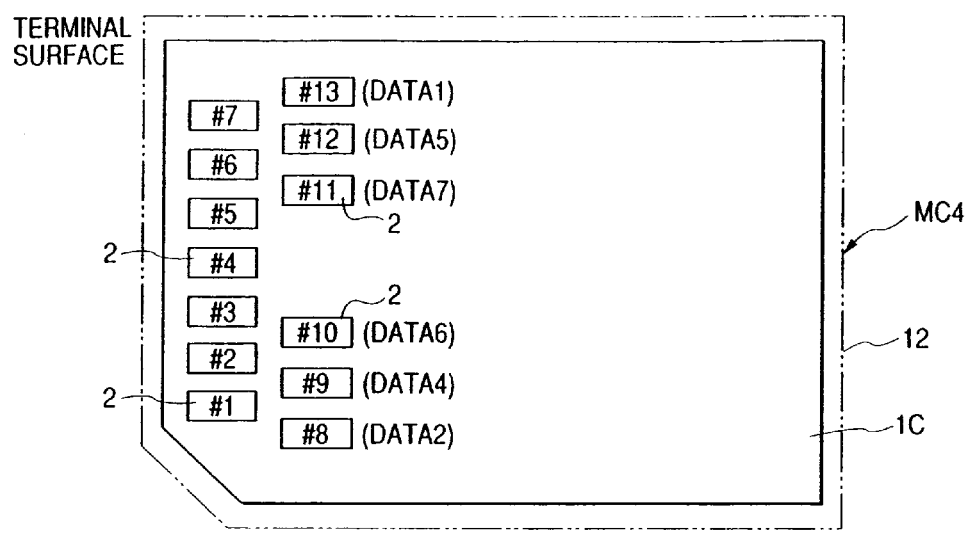
FIG. 3(A) is an explanatory view illustrating a terminal surface of an upward compatible memory card in which data terminals are set to eight bits with respect to a multi media card.
Figure 3B:
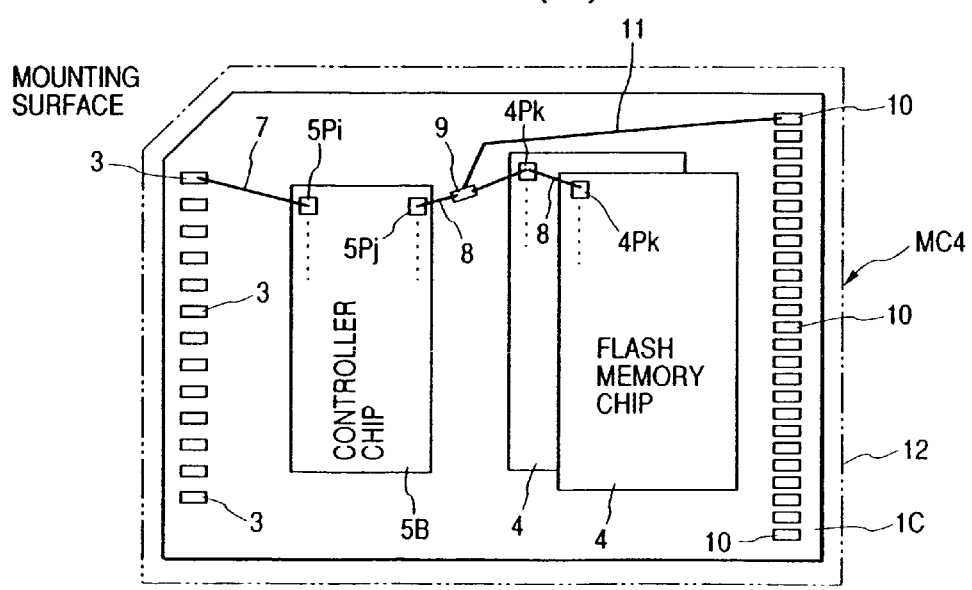
FIG. 3(B) is an explanatory view showing a mounting surface of the upward compatible memory card in which the data terminals are set to the eight bits with respect to the multi media card.
Figure 4A:
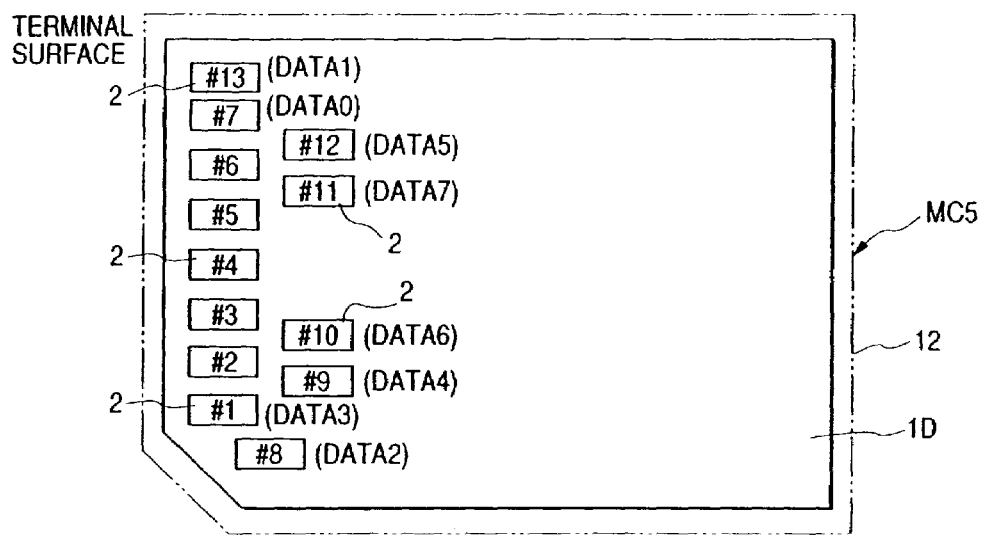
FIG. 4(A) is an explanatory view illustrating a terminal surface of another upward compatible memory card in which data terminals are set to eight bits with respect to a multi media card.
Figure 4B:
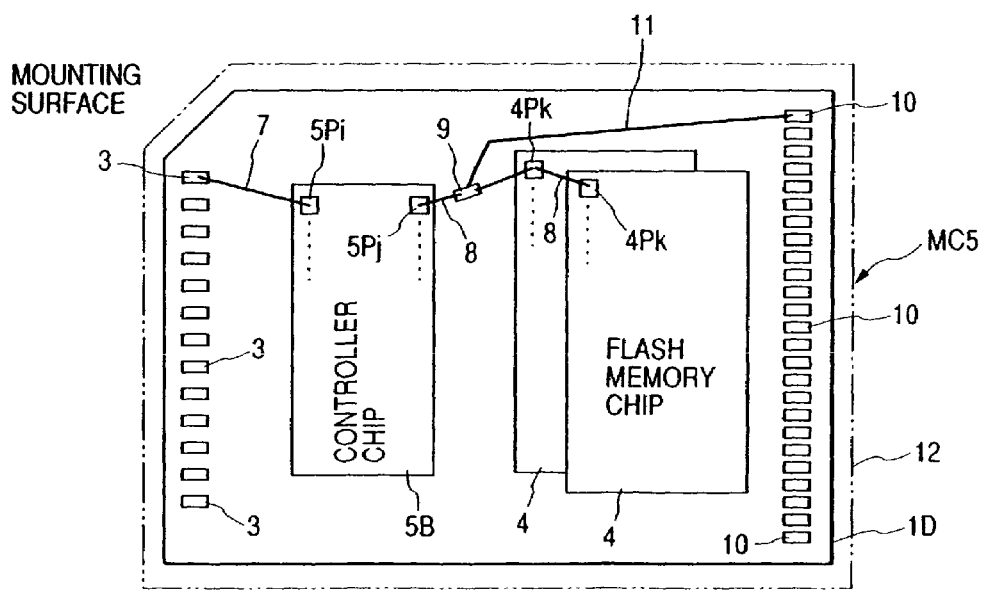
FIG. 4(B) is an explanatory view depicting a mounting surface of another upward compatible memory card in which the data terminals are set to the eight bits with respect to the multi media card.
Figure 5A:
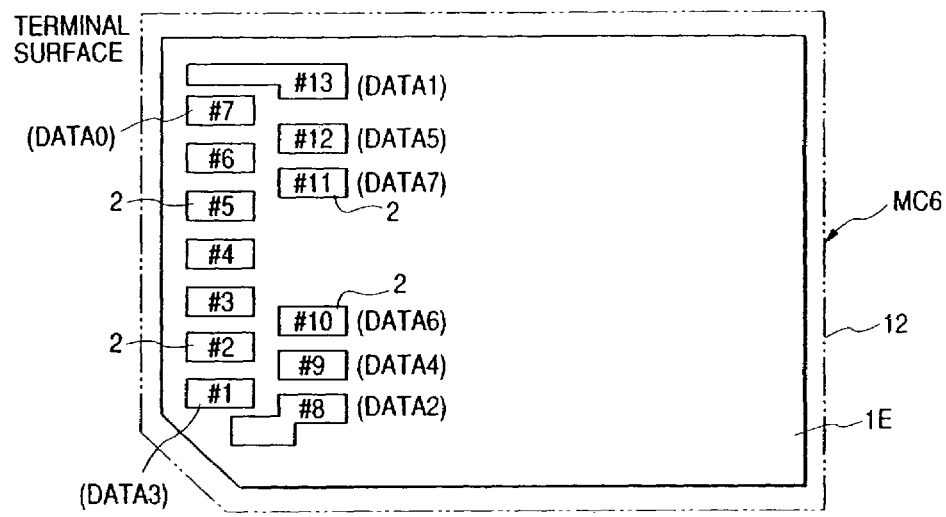
FIG. 5(A) is an explanatory view showing a terminal surface of a further upward compatible memory card in which data terminals are set to eight bits with respect to a multi media card.
Figure 5B:
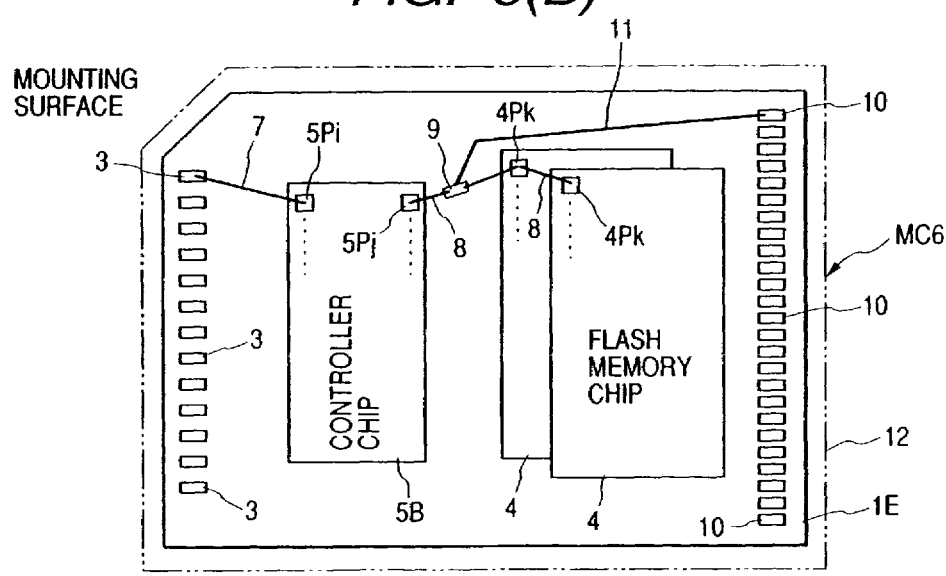
FIG. 5(B) is an explanatory view depicting a mounting surface of the further upward compatible memory card in which the data terminals are set to the eight bits with respect to the multi media card.

Preferred embodiments of the present invention will hereinafter be described in detail with reference to the accompanying drawings.

FIGS. 1 through 5 respectively illustrate upward compatible memory cards based on multi media cards, in which FIGS. 1(A), 2(A), 3(A), 4(A), and 5(A) show terminal surfaces, and FIGS. 1(B), 2(B), 3(B), 4(B), and 5(B) illustrate chip mounting surfaces, respectively.

A memory card (multi media card-based memory card) MC1 based on a multi media card, which is basic to these memory cards, will first be explained with reference to FIG. 6. A card substrate (also called a "multi media card-based card substrate") 1 of the multi media card-based memory card MC1 is configured in such a manner that seven connector terminals 2 respectively identical in shape to one another and rectangular are provided at equal intervals on a terminal surface of a substrate comprising a resin substrate composed of a glass epoxy resin or the like, and connecting pads 3 are formed on a mounting surface thereof in a one-to-one correspondence with the connector terminals 2. Each connecting pad 3 is formed of a conductive pattern such as aluminum, copper, or a ferro-alloy or the like. Each of the connector terminals 2 is formed by applying gold plating, nickel plating or the like to a conductive pattern such as aluminum, copper, or the ferro-alloy or the like. Electrical connections between the connecting pads 3 and the connector terminals 2 are conducted by unillustrated wiring patterns on the card substrate 1 and through holes which bring the front and back of the card substrate 1 into conduction.

For example, electrically rewritable flash memory chips 4 and a controller chip 5 for controlling the flash memory chip 4 are mounted on the mounting surface of the card substrate 1. The controller chip 5 controls a read/write operation effected on each flash memory chip 4 in accordance with instructions given from outside through each connector terminal 2. When data security is taken into consideration, the controller chip 5 may further be provided with the a security function for encrypting or encoding data written into its corresponding flash memory chip 4 and decrypting or decoding the data read out from the flash memory chip 4.

The controller chip 5 has a shape long along the direction of an arrangement of the connector terminals 2 and includes a plurality of connector interface terminals 5Pi electrically connected to their corresponding connector terminals 2 through the connecting pads 3 on the connector terminal 2 side, and a plurality of memory interface terminals 5Pj electrically connected to their corresponding memory chips 4 on the memory chip 4 side. Each of the memory chips 4 has a plurality of controller interface terminals 4Pk electrically connected to the corresponding controller chip 5 on the controller chip 5 side. The connecting pads 3 are connected to their corresponding connector interface terminals 5Pi of the controller chip 5 by bonding wires 7. The memory interface terminals 5Pj of the controller chip 5 are electrically connected to their corresponding controller interface terminals 4Pk of each memory chip 4 by bonding wires 8. Reference numeral 9 indicates a relay pattern.

Further, the card substrate 1 has test terminals 10 electrically connected to the controller chip 5 and each of the memory chips 4 by bonding wires (or wiring patterns) 11. The card substrate 1 is attached and fixed to a casing 12 with its mounting surface directed inwardly. The mounting surface of the card substrate 1 is covered with the casing 12 for its protection and the terminal surface thereof is exposed from the casing 12. Incidentally, one example of the electrical connections made by the bonding wires 7, 8 and 11 is shown in the drawing, and the unillustrated terminals are also electrically connected by their corresponding bonding wires or the like in the same manner as described above.

Now, terminal numbers #1 through #7 are assigned to the connector terminals 2 on the terminal surface for convenience. In a multi media card mode, #1 serves as a reserve terminal (open or fixed to a logical value "1"), #2 functions as a command terminal (which performs a command input and a response signal output), #3 and #6 serve as circuit's ground voltage (ground) terminals, #4 serves as a source voltage supply terminal, #5 serves as a clock input terminal, and #7 serves as a data input/output terminal, respectively. In an SPI (Serial Peripheral Interface) mode, #1 serves as a chip select terminal (negative logic), #2 serves as a data input terminal (for the input of data and commands from a host device to a card), #3 and #6 serve as the circuit's ground voltage (ground) terminals, #4 serves as the source voltage supply terminal, #5 serves as the clock input terminal, and #7 serves as a data output terminal (for the output of data and status from the memory card to the host device), respectively. The multi media card mode is an operation mode suitable for a system in which a plurality of multi media cards are used simultaneously. The identification of each multi media card is done by a card identification ID (relative address) set to its multi media card by the unillustrated host device. The SPI mode is most suitable for application to a simple and inexpensive system, and the operation of each multi media card is selected by a chip select signal supplied to the connector terminal of #1. Even in the case of any of the operation modes, the controller chip 5 performs access control of a memory chip and control for interface with the host device in response to a command given from the host device.

An upward compatible memory card MC2 of a type wherein data terminals are set to four bits with respect to the multi media card, is shown in FIG. 1 by way of example. The present memory card MC2 is different from the memory card MC1 in that nine connector terminals 2 and connecting pads 3 are laid out respectively. The terminal numbers #1 through #7 are identical in layout configuration to the multi media card-based memory card MC1, and the two connector terminals added in this way are defined as terminal numbers #8 and #9 respectively.

The connector terminals 2 of #1 through #7 constitute a connector terminal sequence corresponding to a first row or sequence with respect to a card substrate 1A. The added connector terminals 2 of #8 and #9 constitute a connector terminal sequence corresponding to a second row or sequence placed so as to be spaced away from the connector terminal sequence corresponding to the first sequence. The connector terminals 2 of #8 and #9 are identical in size to other connector terminals 2. The connector terminal sequence corresponding to the first sequence and the connector terminal sequence corresponding to the second sequence are provided so that the layouts of their connector terminals are shifted from one another as viewed in their row or sequence directions. In other words, the connector terminals 2 of #1 and #9, and the connector terminals 2 of #7 and #8 are laid out in staggered form.

The present memory card MC2 is configured in such a manner that the terminals #2 through #7 are assigned to the same functions as the multi media card mode of the multi media card-based memory card MC1, the terminal #1, which was used as the reserve terminal in the corresponding multi media card mode, is defined as a data terminal DATA3 corresponding to a fourth bit, and the added terminals #8 and #9 are respectively defined as a data terminal DATA1 corresponding to a second bit, and a data terminal DATA2 corresponding to a third bit. A data terminal DATA0 corresponding to a first bit corresponds to the same terminal #7 as that in the multi media card mode. Thus, the present memory card MC2 is different from the memory card MC1 in that the input/output of data is allowed in 4-bit parallel in the multi media card mode of the memory card MC1.

Further, the memory card MC2 has a downward compatible mode with respect to the multi media card-based memory card MC1. Namely, the controller chip 5A has a one-bit mode which makes use of one bit #7 of the four-bit data terminals #1, #7, #8 and #9, and a four-bit mode which performs a four-bit parallel input/output using the four-bit data terminals #1, #7, #8 and #9. The one-bit mode is an operation mode which allows the memory card MC2 to operate as the multi media card-based memory card MC1.

The operation mode may be set in response to the state of a predetermined connector terminal or the state of the input of a command from the predetermined connector terminal. For example, when the memory card MC2 is loaded in the card socket of the multi media card-based memory card MC1, the terminals #8 and #9 reach floating. Therefore, when power is turned on, the controller chip 5A may detect floating states of both of the terminals #8 and #9 or a floating state of one thereof to set the one-bit mode to the memory card MC2. When the memory card MC2 having the nine connector terminals 2 is fitted in its dedicated card socket, the terminals #8 and #9 are conductive to a socket terminal of the card socket. Therefore, when power is turned on, the controller chip 5A may detect the supply of a specific signal or command from the host device to both or one of at least the terminals #8 and #9 to set the four-bit mode to the corresponding memory card MC2.

The controller chip 5A is different from the controller chip 5 in that the number of data input/output terminals connected to connecting pads 3 is four. Other configurations are identical to those shown in FIG. 6. Circuit elements each having the same function are identified by the same reference numerals and their detailed description will therefore be omitted.

Another upward compatible memory card MC3 in which data terminals are set to four bits with respect to the multi media card, is illustrated in FIG. 2 by way of example. A card substrate 1B of the memory card MC3 is different from that of the memory card MC2 in that data terminals corresponding to the terminal numbers #8 and #9 are different in layout and size from each other. The data terminal of #8 is completely built or set in a terminal row or sequence corresponding to a first sequence and slightly reduced in width as compared with other connector terminals 2. The data terminal of #9 is laid out at and changed to a position placed outside a data terminal of #1 and placed in a state of being nested toward it. Other configurations are similar to those shown in FIG. 1. Circuit elements each having the same function are identified by the same reference numerals and their detailed description will therefore be omitted.

An upward compatible memory card MC4 in which data terminals are set to eight bits with respect to the multi media card, is illustrated in FIG. 3 by way of example. The present memory card MC4 is different from the memory card MC1 in that thirteen connector terminals 2 and connecting pads 3 are respectively laid out. The terminal numbers #1 through #7 are identical in layout configuration to those of the multi media card-based memory card MC1, and the added six connector terminals are defined as terminal numbers #8 through #13.

The connector terminals 2 of #1 through #7 constitute a connector terminal sequence corresponding to a first row or sequence with respect to a card substrate 1C. The added connector terminals 2 of #8 through #13 constitute a connector terminal sequence corresponding to a second row or sequence placed so as to be spaced away from the connector terminal sequence corresponding to the first sequence. The connector terminals 2 of #8 through #13 are identical in size to other connector terminals 2. The connector terminal sequence corresponding to the first sequence and the connector terminal sequence corresponding to the second sequence are provided so that the layouts of their connector terminals are shifted from one another as viewed in their row or sequence directions. If attention is focused on terminal-to-terminal regions or areas of the connector terminals 2, then an arrangement of terminal-to-terminal areas of the connector terminal sequence corresponding to the first sequence and an arrangement of terminal-to-terminal areas of the connector terminal sequence corresponding to the second sequence are shifted from one another as viewed in their sequence directions. In short, the connector terminals corresponding to the first sequence and the second sequence are disposed in staggered form between the rows or sequences in a manner similar to the memory card MC2 shown in FIG. 1.

The present memory card MC4 is configured in such a manner that the terminals #2 through #7 are assigned to the same functions as the multi media card mode of the multi media card-based memory card MC1, the terminal #1, which was used as the reserve terminal in the corresponding multi media card mode, is defined as a data terminal DATA3 corresponding to a fourth bit, and the added terminals #8, #9, #10, #11, #12 and #13 are respectively successively defined as a data terminal DATA1 corresponding to a second bit, a data terminal DATA4 corresponding to a fifth bit, a data terminal DATA6 corresponding to a seventh bit, a data terminal DATA7 corresponding to an eighth bit, a data terminal DATA5 corresponding to a sixth bit, and a data terminal DATA1 corresponding to a second bit. A data terminal DATA0 corresponding to a first bit corresponds to the same terminal #7 as that in the multi media card mode. Thus, the present memory card MC4 is different from the memory card MC1 in that the input/output of data is allowed in 8-bit parallel in the multi media card mode of the memory card MC1.

Further, the memory card MC4 has a downward compatible mode with respect to the multi media card-based memory card MC1. Namely, a controller chip 5B has a one-bit mode which makes use of one bit #7 of the eight-bit data terminals #1 and #7 through #13, a four-bit mode which performs a four-bit parallel input/output using the four bits #1, #7, #8 and #13 of the eight-bit data terminals #1 and #7 through #13, and an eight-bit mode which performs an eight-bit parallel input/output using the eight-bit data terminals #1 and #7 through #13. The one-bit mode is an operation mode which allows the memory card MC4 to operate as the multi media card-based memory card MC1. The four-bit mode is the same operation mode as the four-bit modes for the memory cards MC2 and MC3.

The operation mode may be set in response to the state of a predetermined connector terminal or the state of the input of a command from the predetermined connector terminal. For example, when the memory card MC4 is loaded in the card socket of the multi media card-based memory card MC1, the terminals #8 through #13 reach floating. Therefore, when power is turned on, the controller chip 5B may detect floating states of the connector terminals 2 for both of the data terminals DATA1 and DATA2 at which a difference from the four-bit mode can be recognized, or a floating state of the connector terminal 2 for one thereof (by exclusively using software or exclusively using a hardware configuration) to set the one-bit mode to the memory card MC on a software or hardware basis.

When the memory card MC4 is fitted in the card socket of the memory card MC2 shown in FIG. 1, the terminals #9 through #12 are brought to floating. Therefore, when power is turned on, the controller chip 5B may detect floating states of all or some connector terminals 2 for the data terminals DATA4 through DATA7 on a software or hardware basis to set the four-bit mode to the memory card MC4.

On the other hand, when the memory card MC4 is loaded in its dedicated card socket, the terminals #9 through #12 are conductive to a socket terminal of the card socket. Therefore, when power is turned on, the controller chip 5B may detect the supply of a specific signal or command from a host device to all or some of at least the data terminals DATA4 through DATA7 to set the eight-bit mode to the corresponding memory card MC4.

The controller chip 5B is different from the controller chip 5 in that the number of data input/output terminals connected to the connecting pads 3 is eight. Other configurations are identical to those shown in FIG. 6. Circuit elements each having the same function are identified by the same reference numerals and their detailed description will therefore be omitted.

Another upward compatible memory card MC5 in which data terminals are set to eight bits with respect to the multi media card, is illustrated in FIG. 4 by way of example. A card substrate ID of the memory card MC5 is different from that of the memory card MC4 in that the layout of the connector terminals 2 of the terminal numbers #8 and #13 is similar to the memory card MC3 shown in FIG. 2. A data terminal of #13 is completely built or set in a terminal row or sequence corresponding to a first sequence and slightly reduced in width as compared with other connector terminals 2. A data terminal of #8 is laid out at and changed to a position placed outside a data terminal of #1 and placed in a state of being nested toward it. Other configurations are similar to those shown in FIG. 3. Circuit elements each having the same function are identified by the same reference numerals and their detailed description will therefore be omitted.

A further upward compatible memory card MC6 in which data terminals are set to eight bits with respect to the multi media card, is illustrated in FIG. 5 by way of example. A card substrate 1E of the memory card MC6 is different from that of the memory card MC4 shown in FIG. 3 in that the shapes of the connector terminals 2 of the terminal numbers #8 and #13 extend so as to contain the connector terminals 2 of the terminal numbers #8 an #13 shown in FIG. 4. Namely, the connector terminal 2 of the terminal number #13 extends to a position where it perfectly adjoins a connector terminal #7 placed in the first sequence and provided at one end as viewed in the row or sequence direction, of the connector terminal sequence. The connector terminal 2 of the terminal number #8 extends to a position where it partly overlaps with a connector terminal #1 placed in the first sequence and included in the connector terminal sequence as viewed in the sequence direction and adjoins the connector terminal #1. Other configurations are similar to those shown in FIG. 3. Circuit elements each having the same function are identified by the same reference numerals and their detailed description will therefore be omitted.

As is apparent from the above, the memory cards MC2 through MC6 shown in FIGS. 1 through 5 respectively have upward compatibility with respect to the multi media card-based memory card MC1 or the unillustrated known multi media card. For example, a low-order or downward memory card can be used by being inserted into a card socket of a high-order or upward memory card. Further, each of the memory cards MC2 through MC6 has also downward compatibility that, for example, an upward memory card can be used by being inserted into a socket of a downward memory card. Described in details, the memory cards MC2 and MC3 shown in FIGS. 1 and 2 have upward-downward compatibility in a relationship with the memory card MC1 shown in FIG. 6. The memory card MC4 shown in FIG. 3 has upward-downward compatibility in a relationship with the memory cards MC1 and MC2 shown in FIGS. 6 and 1. The memory card MC5 shown in FIG. 4 has upward-downward compatibility in a relationship with the memory cards MC1 and MC3 shown in FIGS. 6 and 2. Since the memory card MC6 shown in FIG. 5 has a connector terminal arrangement including complementarity between the arrangement of the connector terminals 2 of the memory card MC4 shown in FIG. 3 and the arrangement of the connector terminals 2 of the memory card MC5 shown in FIG. 4, it can be ranked as an almighty card having upward-downward compatibility even in a relationship with any of FIGS. 1, 2, 3, 4 and 6.

Figure 7:
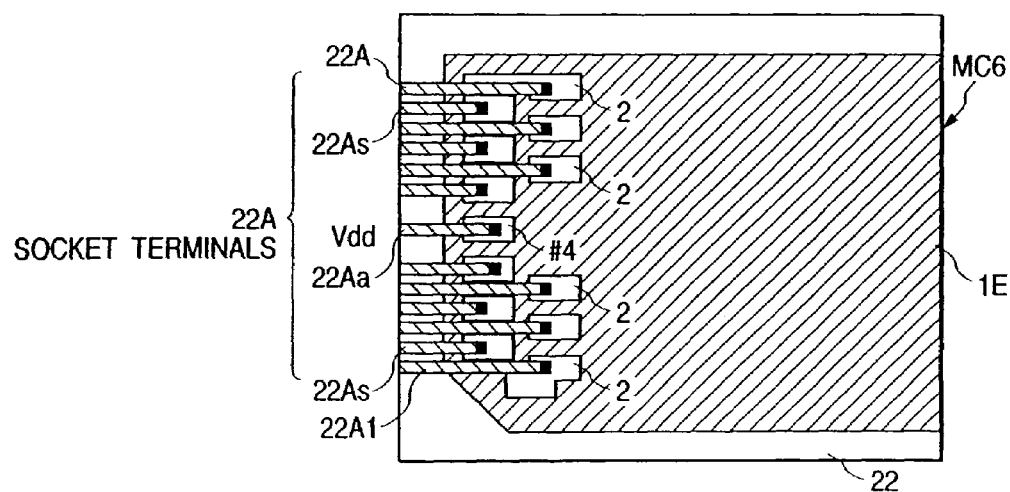
FIG. 7 is an explanatory view depicting the state in which the corresponding memory card is loaded in a card socket corresponding to the almighty card shown in FIG. 5.

FIG. 7 shows the state in which the corresponding memory card MC6 is loaded in a card socket corresponding to the almighty card MC6. The card socket 22 has socket terminals 22A which protrude toward the back or inner portion so as to correspond to their connector terminals 2. Since the plural-sequence layout of the form typified by the staggered fashion is adopted, a configuration or structure in which the amounts of protrusions of the socket terminals 22A of the card socket 22 are changed and they are laid out in tandem, can be adopted with relative ease for the arrangement of the connector terminals 2. Contacts with the connector terminals 2 are tips or leading ends (■ marks) of the socket terminals 22A.

Figure 8:
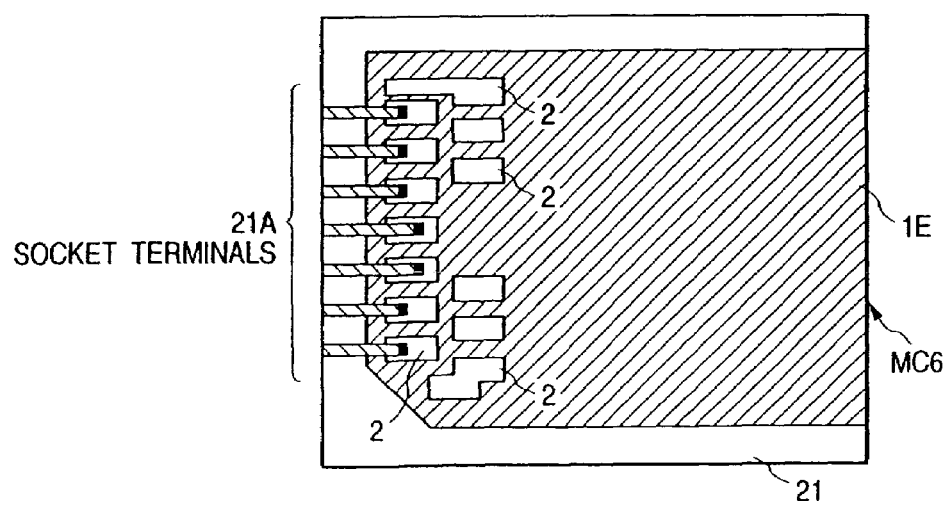
FIG. 8 is an explanatory view showing the state in which the almighty memory card is placed in a card socket corresponding to the multi media card-based memory card shown in FIG. 1.

FIG. 8 shows the state in which the almighty memory card MC6 is loaded in a card socket 21 corresponding to the multi media card-based memory card MC1 shown in FIG. 1 or an unillustrated multi media card. As described above, the memory card MC6 is set to the one-bit mode, so that it can perform the same operation as the multi media card-based memory card MC1 or the unillustrated multi media card.

Figure 9:
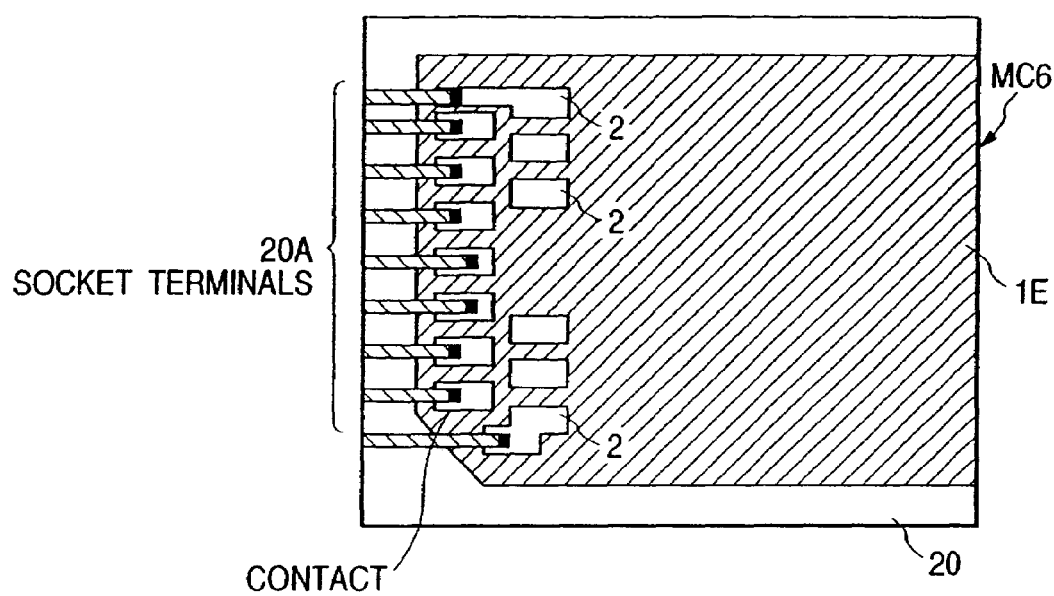
FIG. 9 is an explanatory view illustrating the state in which the almighty memory card is loaded in a card socket corresponding to a multi media card-based memory card.

FIG. 9 shows the state in which the almighty memory card MC6 is loaded in a card socket 22 corresponding to the multi media card-based memory card MC3 shown in FIG. 2. As described above, the memory card MC6 is capable of performing the same operation as the memory card MC3 by being set to the four-bit mode.

Although not illustrated in the drawing in particular, the memory cards MC1 through MC5 shown in FIG. 6 and FIGS. 1 through 4 can respectively be operated in predetermined operation modes even if they are loaded in the card socket 22 shown in FIG. 7. The thickness of each card is substantially equal to a thickness of 1.4 mm of the multi media card. Compatibility available even if the memory cards are mutually inserted into any other type of card sockets, can be implemented.

Figure 10:
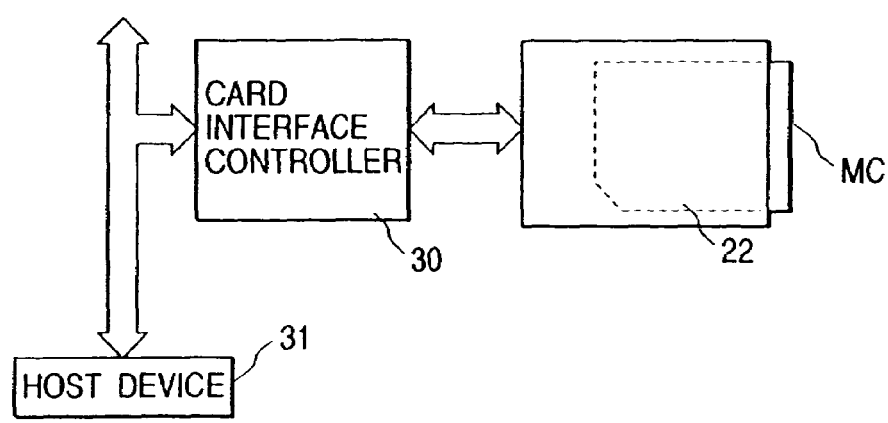
FIG. 10 is a schematic block diagram of a data processing system having the card socket shown in FIG. 7.

FIG. 10 is a schematic block diagram of a data processing system having the card socket 22 shown in FIG. 7. The data processing system shown in the same drawing has a card socket 22 in which the memory card MC6 capable selecting the one-bit mode, four-bit mode or eight-bit mode can be fitted. The card socket 22 has a plurality of socket terminals 22A connected to connector terminals 2 of a memory card MC mounted as shown in FIG. 7. The data processing system is provided with a card interface controller 30 capable of selectively setting the one-bit mode, four-bit mode or eight-bit mode to the memory card MC through the socket terminals 22A. The card interface controller 30 is placed under the control of a host control device 31. The host device 31 is a circuit like a CPU board, for example, and includes a microprocessor and a work RAM for the microprocessor. Further, the host device 31 performs interface control of commands or data with the card interface controller 30 through a bus and control for setting the operation mode to the memory card MC loaded in the card socket 22. Thus, any of the memory cards MC1 through MC6 can be used.

Incidentally, a plurality of types of memory cards can similarly be applicable even to a data processing system having a card socket of a memory card MC2 or MC3 although not shown in the drawing.

In the memory cards MC2 through MC6 shown in FIGS. 1 through 5, the back-and-forth arrangement of the connector terminals 2 in two rows or lines takes into consideration the prevention of a power-to-power short. In the aforementioned examples, no terminals are provided behind the terminals of #4 used as the power supply connector terminals. At portions where the connector terminals 2 are placed back and forth as viewed in a row direction as shown in FIG. 7 by way of example, the socket terminals of the card socket 22 respectively include short terminals 22As and long terminals 22Al alternately compactly laid out at pitches each equal to half of that of each connector terminal 2. On the other hand, if no connector terminal is provided behind, then no long socket terminals 22Al are placed next door to each other on both sides of a socket terminal 22Aa corresponding to the connector terminal of #4 for the source voltage (Vdd) supply as shown in FIG. 7 by way example.

Figure 11A:
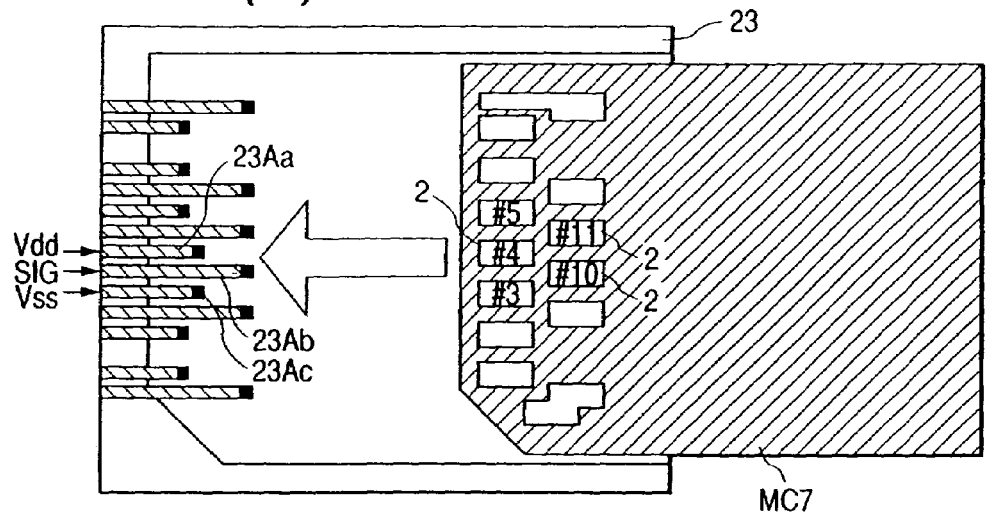
FIG. 11(A) is an explanatory view showing, as a comparative example, a connector terminal arrangement which develops a power-to-power short.
Figure 11B:
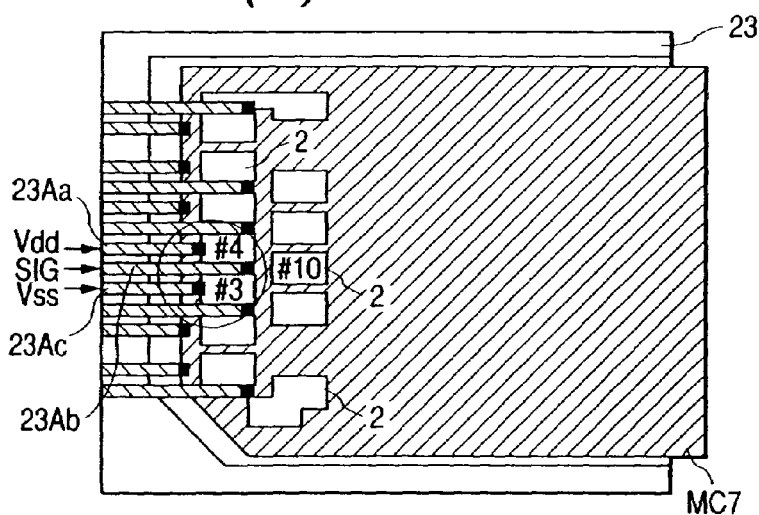
FIG. 11(B) is an explanatory view depicting, as the comparative example, the connector terminal arrangement which develops the power-to-power short.

On the other hand, now consider a memory card MC7 in which data terminals of #10 and #11 are placed behind a connector terminal of #4 for the supply of a source voltage (Vdd) as illustrated in FIG. 11(A) by way of example. In a card socket 23 corresponding to the memory card MC7, long socket terminals 23Ab are disposed next to socket terminals 23Aa corresponding to the connector terminal of #4.

Figure 11C:
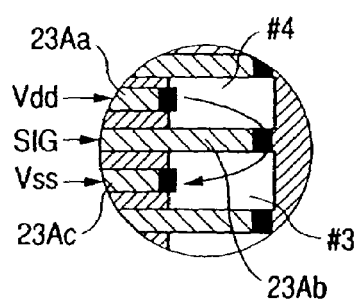
FIG. 11(C) is an explanatory view illustrating, as the comparative example, the connector terminal arrangement which develops the power-to-power short.

When the memory card MC7 is inserted into the card socket 23, contacts (■ marks) of the socket terminals 23Ab are respectively brought into sliding contact with the surface of the connector terminal of #4 to which the source voltage Vdd is inputted, and the surface of a connector terminal of #3 to which a ground voltage is inputted. When, at this time, a socket terminal 23Aa supplied with the source voltage Vdd is made conductive to the connector terminal of #4, and a socket terminal 23Ac supplied with a circuit's ground voltage Vss is rendered conductive to the connector terminal of #3, the source voltage Vdd and the ground voltage Vss are short-circuited through a contact of 23Aa, #4, a contact of 23Ab, #3 and a contact of 23Ac as shown in FIG. 11(C).

The non-provision of the connector terminal behind the terminal of #4 used as the power supply connector terminal as shown in FIG. 7 by way of example allows prevention of the possibility of such a power short beforehand.

Figure 12:
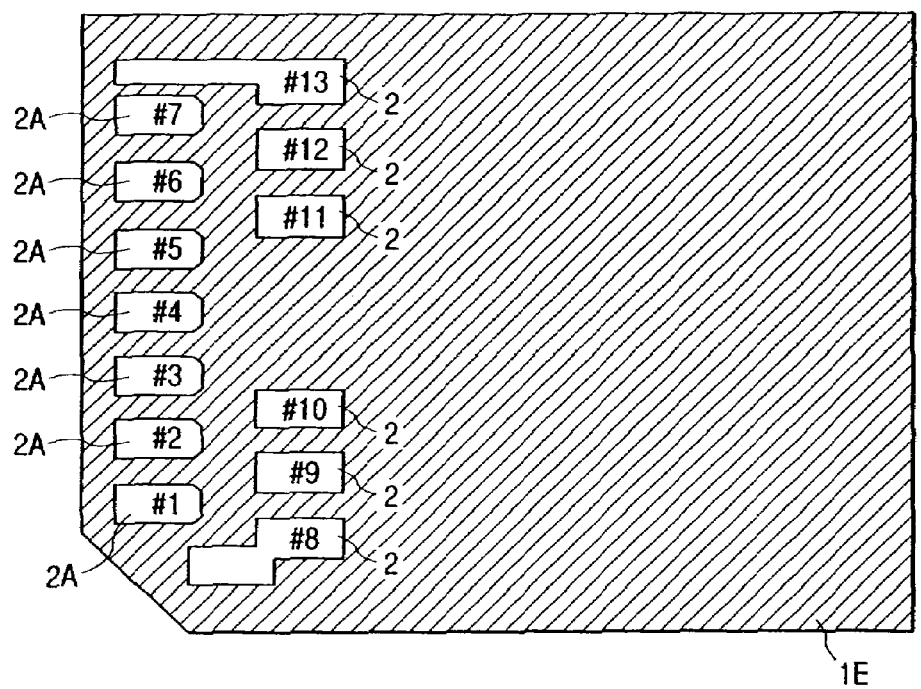
FIG. 12 is an explanatory view showing an example in which measures are taken to prevent a power-to-power short by virtue of chamfered portions of connector terminals.

As a countermeasure against the power short, connector terminal in which broad terminal-to-terminal distances are respectively set to a portion where the connector terminal faces a connector terminal sequence corresponding to a second sequence, may be provided in a connector terminal sequence corresponding to a first sequence as viewed in a memory card inserting direction as shown in FIG. 12 by way of example. In brief, relatively large chamfered portions may be formed at the corners of the rears of the connector terminals 2A.

Figure 13:
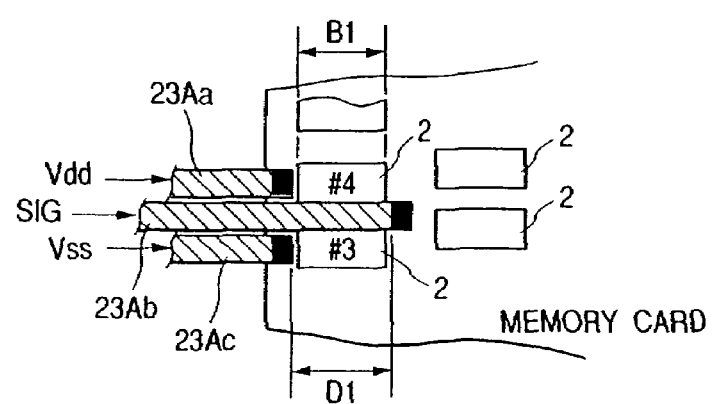

As another countermeasure against the power short, a distance D1 extending from a leading end of each of contacts of short socket terminals 23Aa and 23Ac to a base end of a contact of a long socket terminal 23Ab may be set greater than a width dimension B1 of each of connector terminals of #3 and #4 as shown in FIG. 13 by way of example. Further, the thickness of the socket terminal 23Ab may sufficiently be set smaller than interval dimensions of the connector terminals of #3 and #4. However, when it is desired to prevent the power short according to dimensional provisions, a processing error and an assembly error occur. Further, since it is impossible to regard the memory card itself as a rigid body, it is advisable to take the countermeasures shown in FIGS. 7 and 12 for the purpose of preventing the power short with a high degree of reliability.

In the memory cards MC1 through MC6 described in FIGS. 1 through 6, their layout on the card substrate is set in order of the connector terminals 2, the controller chips 5 (5A and 5B) and the flash memory chips 4 with respect to one side of the card substrate. The connector terminals 2 are exposed from the casing 12. Each of the controller chips 5 (5A and 5B) has a shape long along the direction of the arrangement of the connector terminals 2 and includes a plurality of connector interface terminals 5Pi electrically connected to the connector terminals 2 through the connecting pads 3 on the connector terminal 2 side, and a plurality of memory interface terminals 5Pj electrically connected to the corresponding flash memory chip 4 on the flash memory chip 4 side. The flash memory chip 4 has a plurality of controller interface terminals 4Pk electrically connected to the controller chip 5 (5A, 5B) on the controller chip 5 (5A, 5B) side. The terminals 5Pi, 5Pj and 4Pk comprise, for example, bonding pads respectively.

According to the above, since the long controller chip 5 (5A, 5B) is caused to approach the connector terminals 2 and the flash memory chip 4 is placed on the side opposite to the controller chip 5 (5A, 5B), the area for laying out each flash memory chip 4 can be made relatively large. Further, wirings for respectively electrically connecting the connector terminals 2, the controller chip 5 (5A, 5B) and each memory chip 4 may be wired regularly in their arrangement directions. It is not necessary to adopt wirings which bypass each chip and are folded complicatedly.

The connecting pads 3 may be electrically connected to their corresponding connector interface terminals 5Pi of the controller chip 5 (5A, 5B) through bonding wires 7. Further, the memory interface terminals 5Pj of the controller chip 5 (5A, 5B) may be electrically connected to their corresponding controller interface terminals 4Pk of each flash memory chip 4 through bonding wires 8 and conductive patterns 9. Thus, this can simplify each wiring layer of the card substrate and is capable of contributing a cost reduction.

Figure 14:
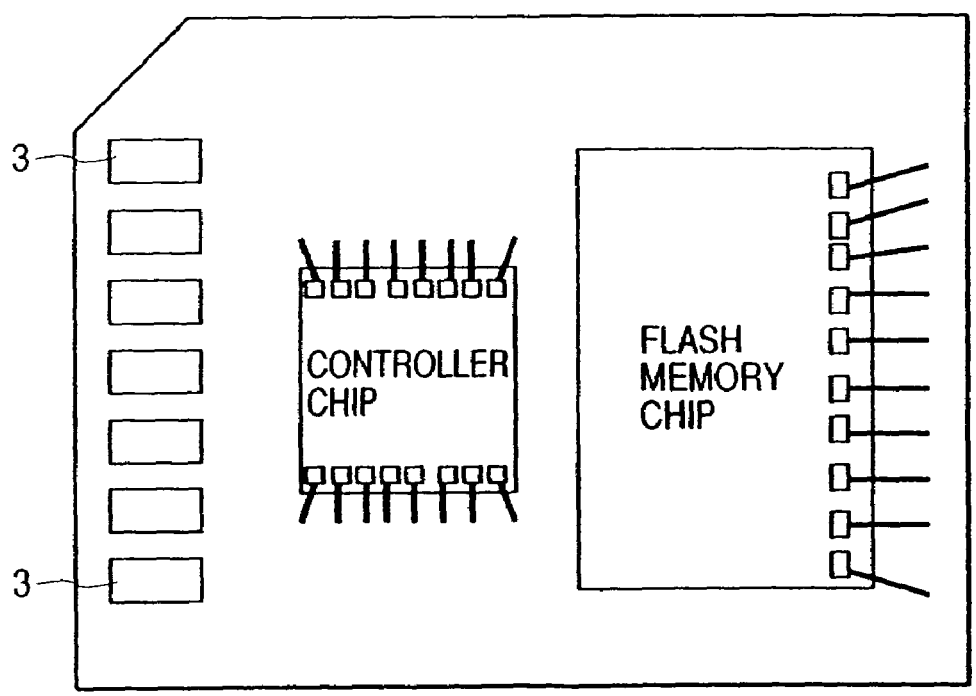
FIG. 14 is an explanatory view showing a comparative example in which wiring routing increases on a card substrate.

When interface terminals like bonding pads of a controller chip and a flash memory chip are placed in random orientations with respect to bonding pads 3 as shown in a comparative example of FIG. 14, wirings for respectively electrically connecting the connecting pads, the controller chip and the memory chip bypass the chips, pass complicated paths, complicate each wiring layer of the card substrate, degrade electrical characteristics, make an increase in cost and decrease reliability.

Figure 15:
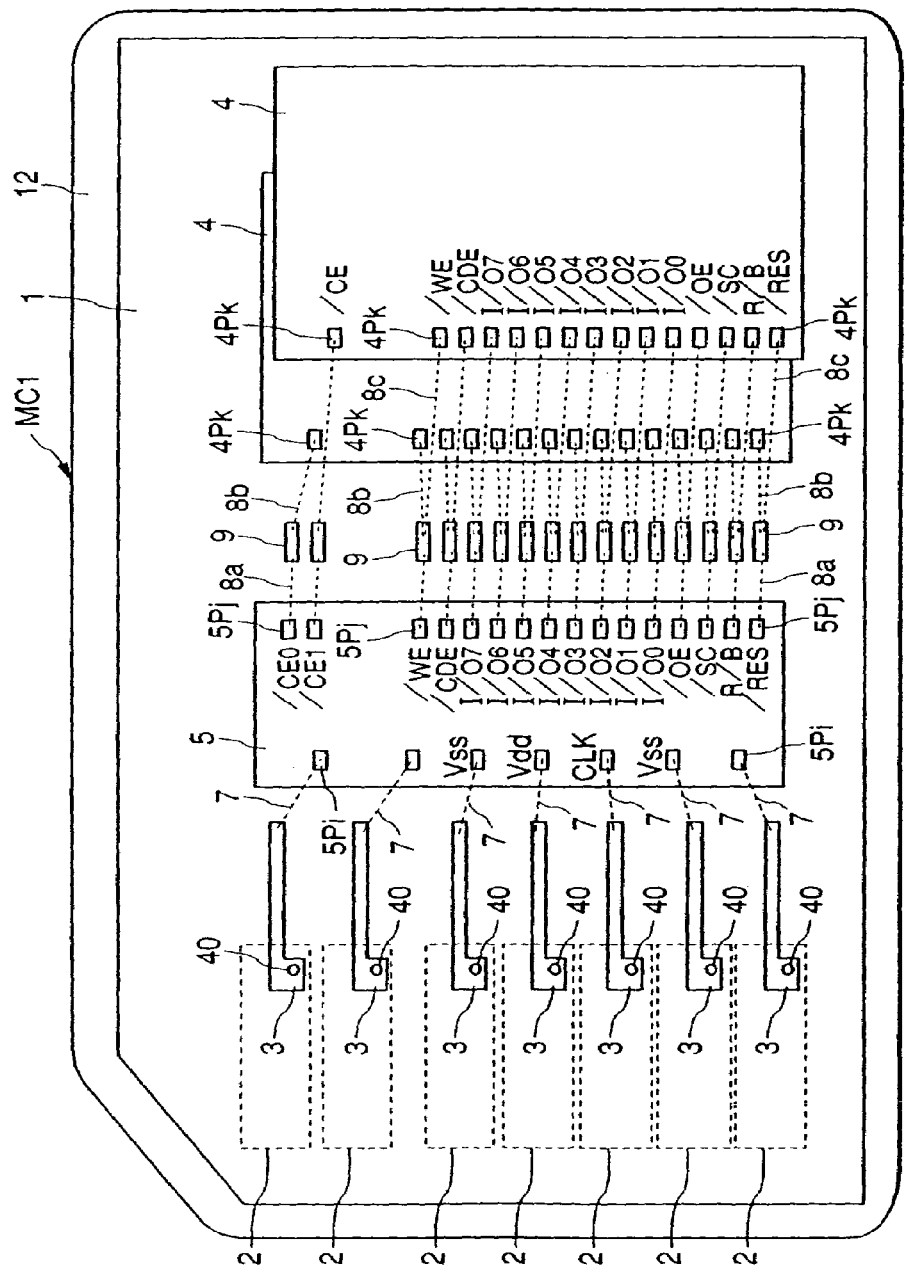
FIG. 15 is a plan view showing, as an example, a detailed configuration of a mounted state of circuit elements of the multi media card-based memory card shown in FIG. 6.
Figure 16:
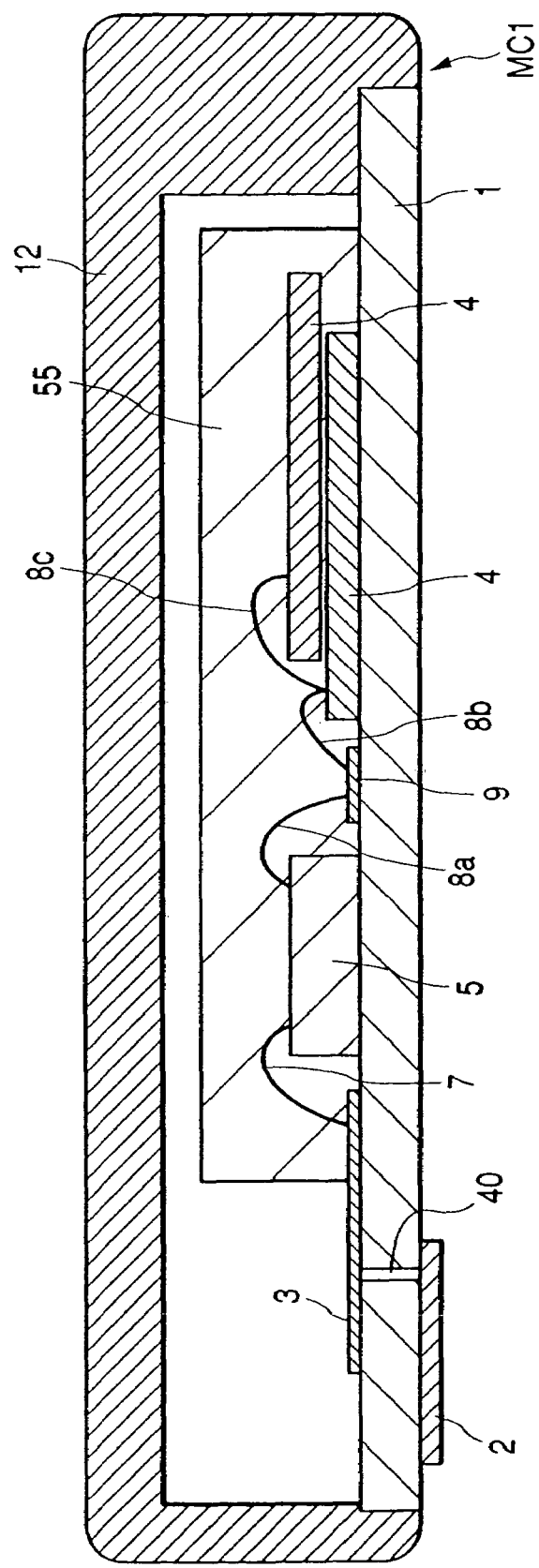
FIG. 16 is a vertical cross-sectional view of FIG. 15.

A detailed configuration of a state in which circuit elements are mounted on the multi media card-based memory card MC1 shown in FIG. 6 is illustrated in FIG. 15 by way of example on a plane basis. FIG. 16 is a vertical cross-sectional view of the configuration shown in FIG. 15. Test terminals 10 are not illustrated in the configurations shown in FIGS. 15 and 16. Further, FIGS. 15 and 16 include portions designated at reference numerals different from those shown in FIG. 6.

A card substrate 1 comprises a glass epoxy resin or the like. The connector terminals 2 are formed on the back of the card substrate 1 by conductive patterns. The controller chip 5 and the flash memory chips 4 are mounted on the surface of the card substrate 1 through wiring patterns and conductive patterns. In the drawing, reference numerals 3 respectively indicate connecting pads electrically connected to their corresponding connector terminals 2 via through holes 40.

Referring to FIG. 15, the bonding wires 8 shown in FIG. 6 are illustrated as 8a, 8b and 8c in parts. The controller chip 5 and the memory chips 4 are so-called bare chips, and the external terminals 5Pi, 5Pj and 4Pk thereof are bonding pads such as aluminum, an aluminum alloy, copper or a ferro-alloy or the like.

Each of the flash memory chips 4 has a memory cell array in which, for example, non-volatile memory cell transistors each having a control gate, a floating gate, and a source and drain are placed in matrix form. The flash memory chip 4 performs operations such as data reading, erasing, writing, verifying, etc. according to externally-supplied commands and addresses. The flash memory chip 4 includes, as plural external terminals 4Pk, an input terminal used for a chip enable signal (also called "chip select signal") /CE for providing instructions for a chip selection, an input terminal used for a write enable signal /WE for providing instructions for a write operation, input/output terminals I/O0 through I/O7, an input terminal used for a command-data enable signal /CDE for providing instructions as to whether the input/output terminals I/O0 through I/O7 should be used for either the input/output of data or the input of addresses, an input terminal used for an output enable signal /OE for providing instructions for an output operation, an input terminal used for a clock signal /SC for providing instructions for data latch timing, an output terminal used for a ready/busy signal R/B for giving instructions as to whether the flash memory chip is being in a write operation, to the outside, and an input terminal used for a reset signal /RES.

The controller chip 5 controls the reading and writing of data from and into the flash memory chip 4 according to instructions given from outside. Further, the controller chip 5 has a security function for encrypting or encoding data to be written into the flash memory chip 4 in consideration of data security or copyright protection or the like and decrypting or decoding the data read from the flash memory chip 4.

The external terminals 5Pi of the controller chip 5 correspond to input/output functions of the connector terminals 2. An output terminal used for a chip select signal /CE0 with respect to the flash memory chip 4, and an output terminal used for a chip select signal /CE1 with respect to the flash memory chip 4 are included as the external terminals 5Pj for obtaining memory access to the controller chip 5. Further, external terminals, which correspond to the external terminals 4Pk of the flash memory chip 4 and are reversed in input/output direction, are provided as the external terminals 5Pj.

As described above, the bonding wires 7 are used to connect the connecting pads 3 and their corresponding external terminals 5Pi of the controller chip 5, and the bonding wires 8a, 8b and 8c are used to connect the controller chip 5 and the flash memory chip 4. Thus, a large number of wiring patterns having the same functions as the connections thereof by the bonding wires may not be formed on the card substrate 1 in a compact mass. Spaces lying above the controller chip 5 and each flash memory chip 4 can be utilized for wiring. In brief, substrate wiring can be simplified owing to air wiring of bonding wires. Accordingly, this can contribute to a reduction in the cost of the card substrate 1.

In the configuration shown in FIG. 15, the two flash memory chips 4 are parallel-connected to the controller chip 5 by the bonding wires. At this time, the two non-volatile memory chips 4 are mounted on the card substrate 1 in their position-shifted and overlapped state so that the external terminals 4Pk thereof are exposed. Thus, the distance to the controller chip 5 becomes short and routing lengths of the bonding wires 8b and 8c become short as compared with the case in which the non-volatile memory chips 4 are laid out without their overlapping. Accordingly, the possibility that undesired contacts and breaks of the bonding wires will occur, can be lessened. The amounts of shifts of a plurality of non-volatile memory chips at the time that they are stacked on one another, may be determined within a range in which one lower chip can exist below bonding external terminals of an upper chip. This is because when no lower chip exists below the bonding external terminals, there is a possibility that each chip will suffer damage due to a mechanical force at bonding.

Referring to FIG. 16, the controller chip 5 and non-volatile memory chips 4 are molded with a thermosetting resin 55 as a whole. At this time, each through hole 40 is not included in an area molded by the thermosetting resin 55. Thus, it is possible to eliminate the possibility that when they are molded under pressure, the mold resin 55 will leak into the reverse side of the card substrate 1 via each through hole 40, thereby causing a mold failure.

In FIG. 16, the casing 12 for covering the surface of the card substrate 1 can be made up of, for example, a metal cap or the like whose surface is subjected to insulating coating. Thus, as compared with a resin cap, it provides countermeasures against EMI (Electro Magnetic Interference) and also allows sealing based on mechanical fastening and high-temperature-based cap sealing.

Increasing the thickness of the controller chip 5 as compared with that of each flash memory chip 4 as described in FIG. 16 allows prevention of the occurrence of a failure in multi media card.

In FIG. 16, the thickness of the flash memory chip 4 is 220 μm and the thickness of the controller chip 5 is 280 μm. The height of the controller chip 5 after its mounting is 320 μm. A post-mounting height at the time that the two flash memory chips 4 are stacked and mounted, reaches 520 μm inclusive of the thickness of an adhesive layer for bonding their chip reverse sides to each other. Further, since the height of each bonding wire loop formed on the flash memory chips 4 and the controller chip 5 is about 200 μm, the whole height up to the uppermost portion of the bonding wire loop at the time that the two flash memory chips 4 are stacked, reaches 720 μm. Thus, the controller chip 5 is thicker than the flash memory chip 4. Further, the controller chip 5 is thinner than the thickness of the two flash memory chips 4. Alternatively, the post-mounting height of the controller chip 5 is about equal to or lower than the height of the two stacked and mounted flash memory chips 4.

It is thus necessary that in the memory card whose thickness is limited according to standards, when the chips are stacked on each other and mounted, the chips to be stacked are formed thin in advance to avoid failures such as the exposure of bonding wires on the mold resin 55. Increasing the thickness of the controller chip 5 as compared with that of the flash memory chip 4 in the memory card in which the flash memory chips 4 are placed in stacked form, yields the following effects.

A sufficient increase in the thickness of the controller chip 5 prevents failures such as cracking and chipping-off of the chip and also improves a handling characteristic at the time that each chip is placed on the substrate. Thus, even in the case of a memory card equipped with a large number of chips as in the case where the chips are placed in stacked form, a reduction in yield can be prevented from occurring and throughput in a mounting process can be improved.

Excessively thinning the thickness of the controller chip 5 yields an increase in the possibility that each chip will buckle due to pressure at the injection of a mold resin and an internal stress developed by curing and shrinkage at the time that the mold resin is cured. In the case of the flash memory chips 4 placed in stacked form as compared with it, a sufficient strength can be obtained even in the case of a thin chip because they are stacked, and buckling can be avoided. Thus, a chip placed in a single layer needs to increase its thickness as compared with that of chips mounted in stacked form with a view toward obtaining a strength equivalent to such an extent as to be capable of avoiding the buckling.

The controller chip 5 is mounted to a portion nearer the connector terminals 2 as compared with the flash memory chips 4. In the case of the portion nearer each connector terminal 2, distortion is developed in the memory card due to a stress given or suffered from the socket terminal 22 connected to the connector terminals 2 when the memory card is in use. Such distortion is transferred to the controller chip 5 nearer the connector terminals 2 as a large internal stress. As a result of the repeated use of the memory card, there is a possibility that a failure such as the generation of chip's cracking will occur. However, if a structure or configuration is adopted wherein the chip mounted onto the portion nearer the connector terminals 2 is set thicker than each chip mounted to a portion far from the connector terminals 2, then resistance to the stress suffered from the connector terminals 2 can be sufficiently ensured and a failure such as breakage developed inside the memory card due to its repeated use can be avoided.

The card substrates 1, and 1A through 1E are respectively provided with the test terminals 10 connected to the controller chip 5 and the memory chips 4 in order to efficiently test the post-mounting controller chip 5 and flash memory chips 4. Since the test terminals 10 may be avoided from being always exposed after they have been incorporated into a casing, the test terminals are formed on a surface on the side opposite to a forming surface of the connector terminals 3 of the card substrate from this point of view.

Figure 17:
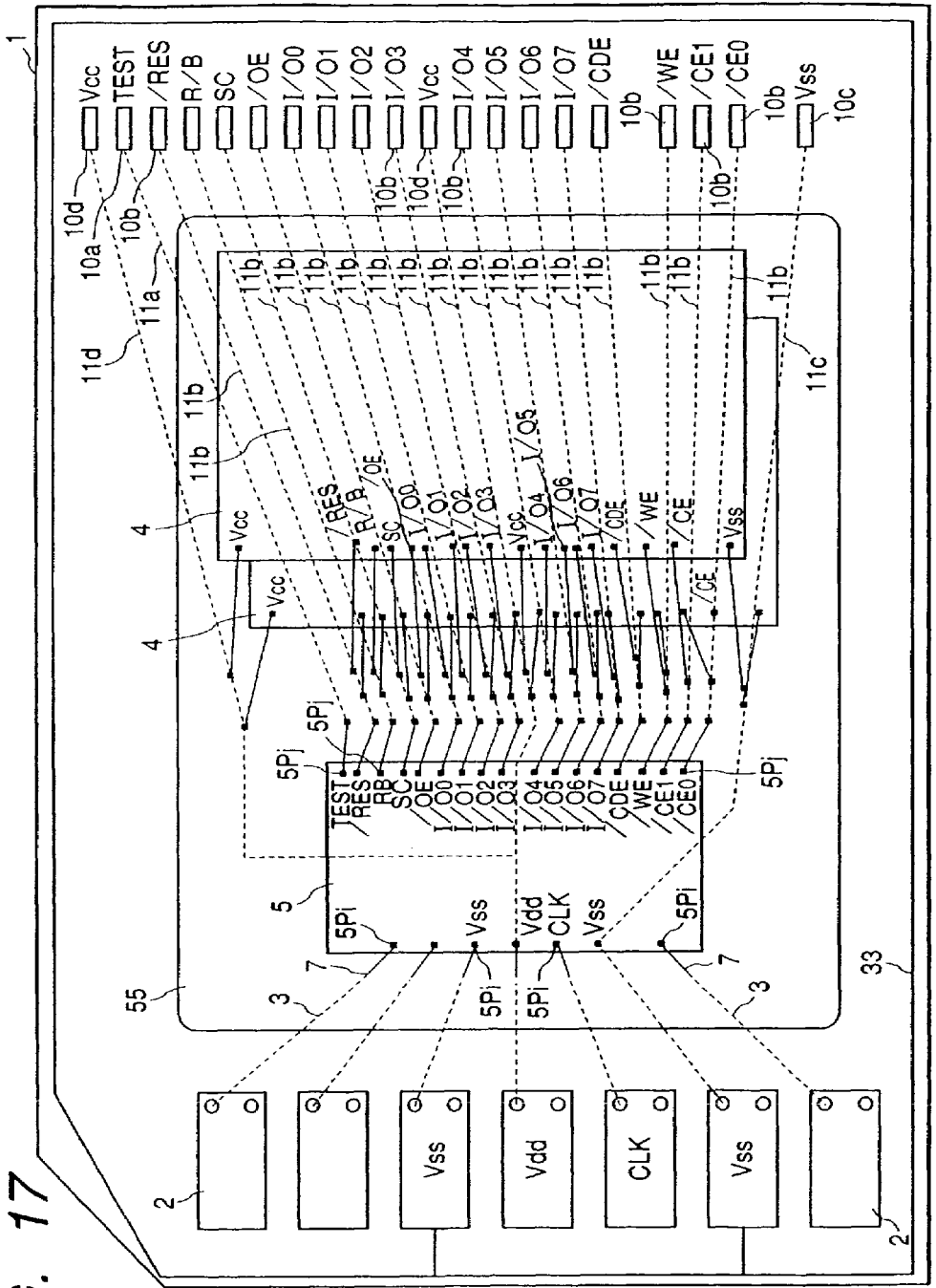
FIG. 17 is a plan view exclusively illustrating, as an example, the state of connections of test terminals and the like of the multi media card-based memory card shown in FIG. 6.

The state of connections of the test terminals of the multi media card-based memory card MC1 shown in FIG. 6 is illustrated in FIG. 17 by way of example. In FIG. 17, the state of connections between a controller chip 5 and each non-volatile memory chip 4 is simplified in the drawing to put emphasis on the state of connections of the test terminals. In FIG. 17, circuit elements-each having the same function as FIG. 6 are identified by the same reference numerals and their detailed description will therefore be omitted.

The controller chip 5 has an input terminal (also described simply "test terminal /TEST") for a test signal /TEST pulled up thereinside as one of external terminals 5Pj although it is not shown in FIG. 6. When a low level is inputted to the test terminal /TEST, the test terminal /TEST serves so as to control a terminal for interface with each non-volatile memory chip 4, particularly, an output terminal and an input/output terminal to a high-output impedance state or an input/output inoperable or not-ready state. Further, a TEST input terminal may be input-controlled according to a serial command (encrypted or encoded command) for security.

A test control terminal 10a connected to the test terminal /TEST on the memory interface side of the controller chip 5 by a wiring 11a is formed on the card substrate 1. Test terminals 10b connected to all the remaining external terminals 5Pj on the memory interface side of the controller chip 5 by wirings 11b in a one-to-one correspondence with one another are formed on the card substrate 1. There are also provided a testing ground terminal 10c connected to an external terminal for a ground power source Vss by a wiring 11c, of external terminals 5Pi on the connector interface side of the controller chip 5, and a testing power terminal 10d connected to an external terminal for a source voltage Vdd by a wiring 11d, of the external terminals 5Pi on the connector interface side of the controller chip 5 in the same manner as described above. Designated at numeral 33 in FIG. 17 is a guard ring added to the card substrate 1 for the purpose of preventing electrostatic discharge damage. The guard ring 33 orbits or goes around the card substrate 1 and is connected to circuit's ground power terminals.

Since a control terminal 10a for supplying a control signal /TEST for controlling each terminal on the memory interface side of the controller chip 5 to a high impedance state to the controller chip 5 is provided, it becomes easy to singly test the memory chips 4 through the use of test terminals 10*b* through 10*d*.

Since the test terminals 10*b*, 10*c* and 10*d* are formed on the card substrate 1, the non-volatile memory chips 4 can directly be accessed and controlled from outside via the test terminals 10*b*, 10*c* and 10*d* when the controller chip 5 is brought to a memory control inoperable state due to electrostatic discharge damage. Thus, if data still remains in each non-volatile memory chip 4 even when the controller chip 5 is brought to destruction, then it can easily be recovered.

Figure 18:
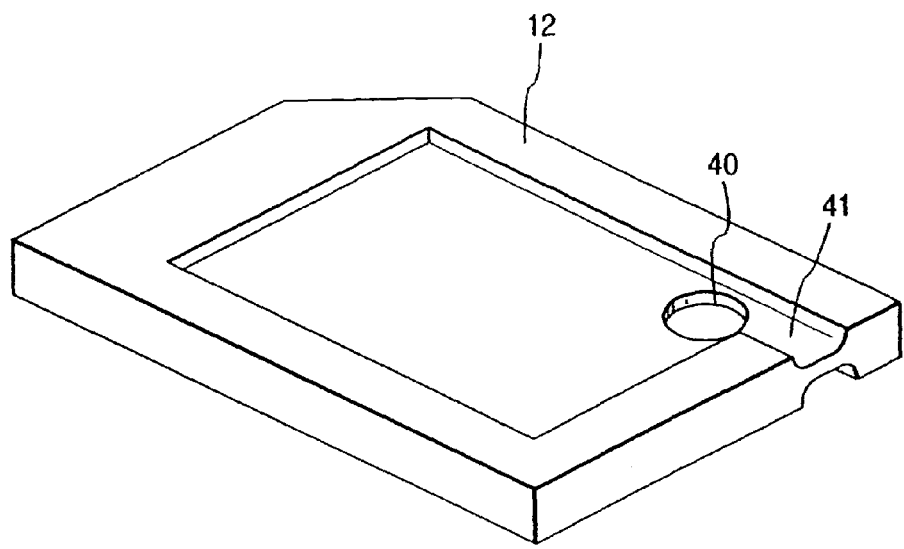
FIG. 18 is a perspective view showing a first example in which a through hole is defined in a memory card.
Figure 19:
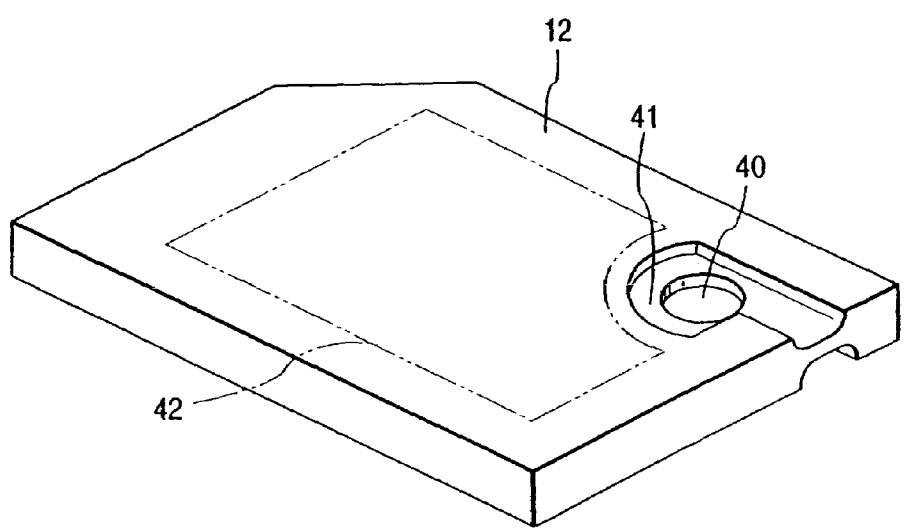
FIG. 19 is a perspective view illustrating a second example in which a through hole is defined in a memory card.

The memory cards such as the multi media card-based cards described in FIGS. 1 through 6 are relatively thin like 1.4 mm and relatively small like 24 mm×32 mm. Through holes 40, each of which extends through the front and back of the casing 12 of each of the memory cards MC1 through MC6 as illustrated in FIGS. 18 and 19 by way of example, are defined in the casing 12 to improve the storage of such memory cards MC1 through MC6 and their handling performance. The periphery of the through hole 40 is counter-bored and communicates with an outer edge of the casing 12. A counter-bored portion 41 diverts or uses a step portion (cavity area) for displaying information such as the type or classification of each memory card in the example of FIG. 18. In FIG. 19, a counter-bore portion 41 is particularly formed. In FIG. 19, a portion designated at numeral 42 is an area for displaying the information such as the classification of the memory card. A so-called grommeted hollow member may be inserted to reinforce the periphery of the through hole 40.

Figure 20:
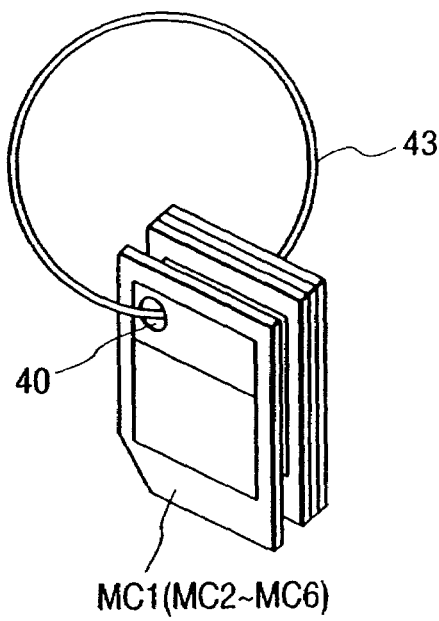
FIG. 20 is a perspective view showing, as an example, a first use form of through holes defined in memory cards.

If an openable/closable ring 43 is drawn through a through hole 40 as shown in FIG. 20 by way of example, it then becomes easy to store or hold and carry on a memory card MC1 (corresponding to each of MC2 through MC6). A state in which the ring 43 is put through the through hole 40, may be regarded as a state of its shipment.

Figure 21:
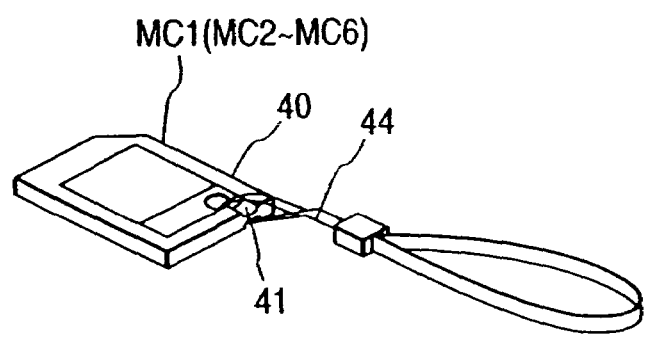
FIG. 21 is a perspective view illustrating a second use form of a through hole defined in a memory card.
Figure 22A:
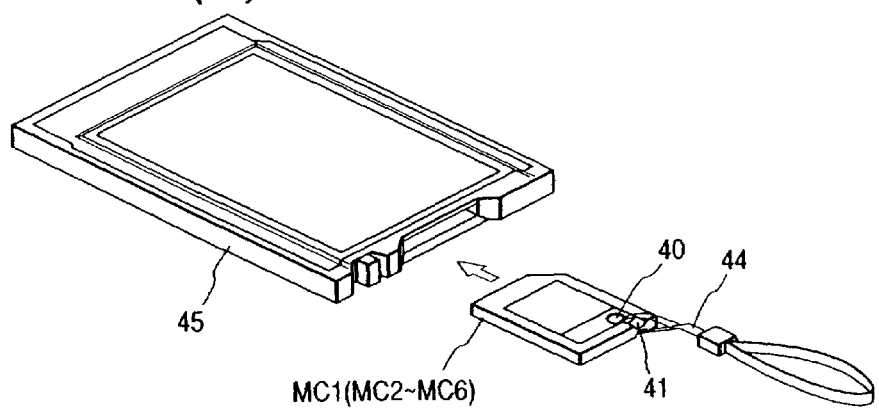
FIG. 22(A) is an explanatory view depicting the operation of mounting of the memory card shown in FIG. 21 in a PC card adapter.
Figure 22B:
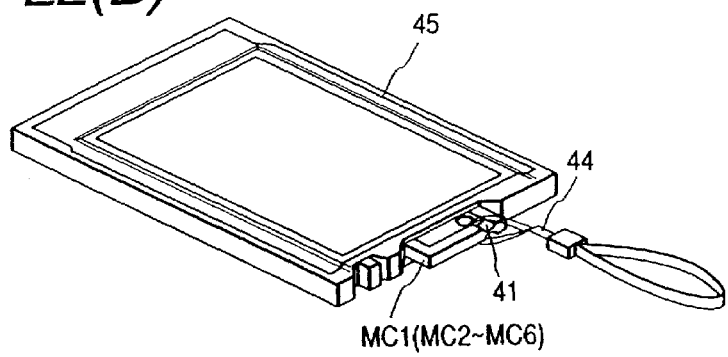
FIG. 22(B) is an explanatory view showing the operation of fitting of the memory card shown in FIG. 21 in the PC card adapter.
Figure 22C:
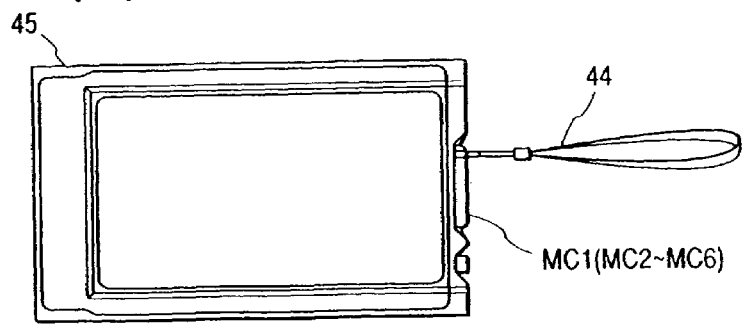
FIG. 22(C) is an explanatory view illustrating the operation of mounting of the memory card shown in FIG. 21 in the PC card adapter.

A strap 44 may be drawn through a through hole 40 as shown in FIG. 21 by way of example. Now consider where a memory card MC1 (corresponding to each of MC2 through MC6) is mounted in a PC card adapter 45 while a strap 44 remains attached thereto, as shown in FIG. 22 by way of example. When the mounting of the memory card MC1 therein proceeds in order of the same FIGS. (A), (B) and (C), the through hole 40 is inserted into the PC card adapter 45. At this time, the counter-bored portion 41, which communicates with the outer edge of the memory card MC1 (corresponding to each of MC2 through MC6), serves as an escape or clearance for a connecting ring of the strap 44. Thus, the strap 44 no interferes with the mounting of the memory card MC1 (corresponding to each of MC2 through MC6) in the PC card adapter.

Figure 23:
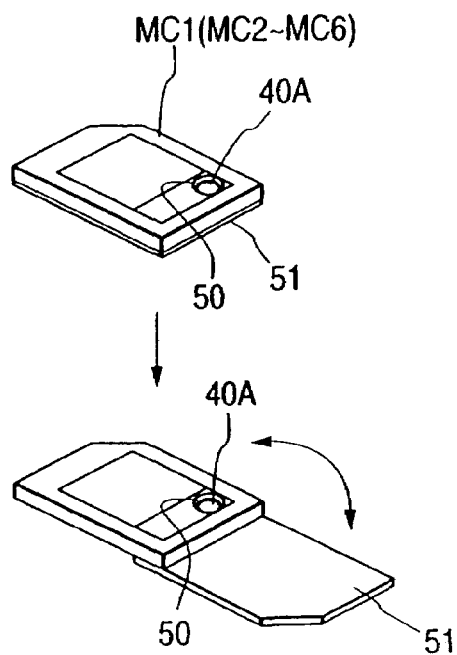
FIG. 23 is a perspective view showing an example in which a memory card is provided with a protective cover.

A hollow rivet 50 may be used in the through hole 40 to pivot a protective cover 51 for connector terminals 2 (rotatably support it) as shown in FIG. 23 by way of example. Namely, a flat-plate protective cover 51 substantially analogous to a terminal surface of the memory card MC1 (corresponding to each of MC2 through MC6) is prepared. The protective cover 51 is superimposed on a terminal surface (corresponding to a surface on which the connector terminals 2 are formed) of the memory card MC1 (corresponding to each of MC2 through MC6). The hollow rivet 50 is inserted into the through the through hole 40 from thereabove, and a protruding end of the hollow rivet 50 is deformed broadly, thereby making it possible to open and close the protective cover 51. The protective cover 51 is a thin plastic plate, for example, and covers the connector terminals 2 in a state of being superimposed on the casing 12. Since the protective cover 51 can be restrained from undesirably contacting the connector terminals 2, the prevention of electrostatic discharge damage of the controller chip 5 mounted in the memory card MC1 (corresponding to each of MC2 through MC6) can be enhanced from this point of view.

Figure 24:
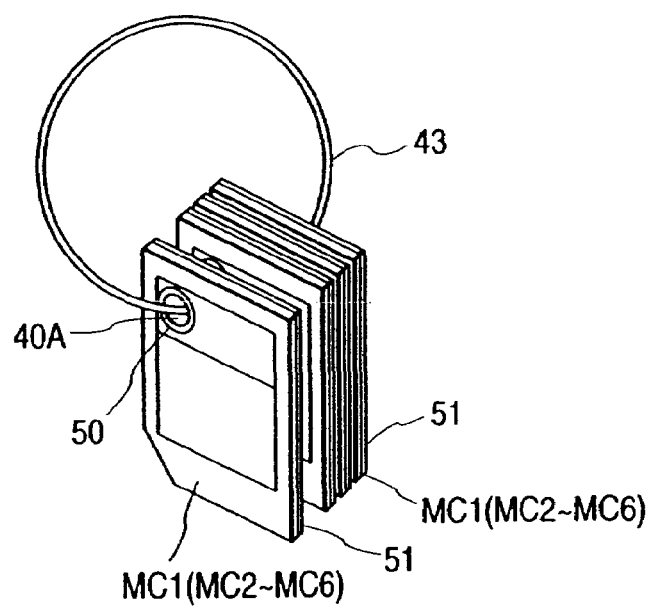
FIG. 24 is a perspective view depicting, as an example, the manner of storage of each memory card provided with its corresponding protective cover.

If the ring 43 is put through a hollow-shaped hole 40A of the hollow rivet 50 as shown in FIG. 24, then it provides convenience to the storage and carrying of the memory card MC1 (corresponding to each of MC2 through MC6).

Figure 25A:
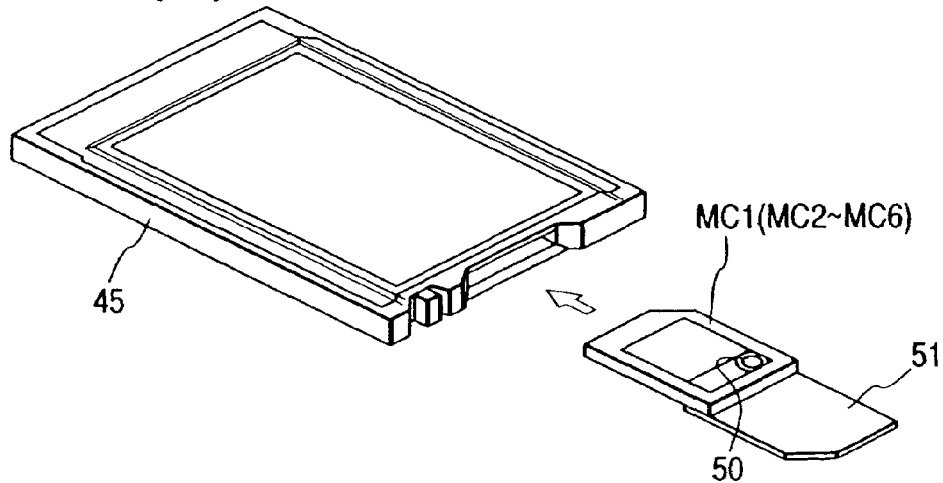
FIG. 25(A) is an explanatory view-showing the operation of mounting of the memory card shown in FIG. 23 in a PC card adapter.
Figure 25B:
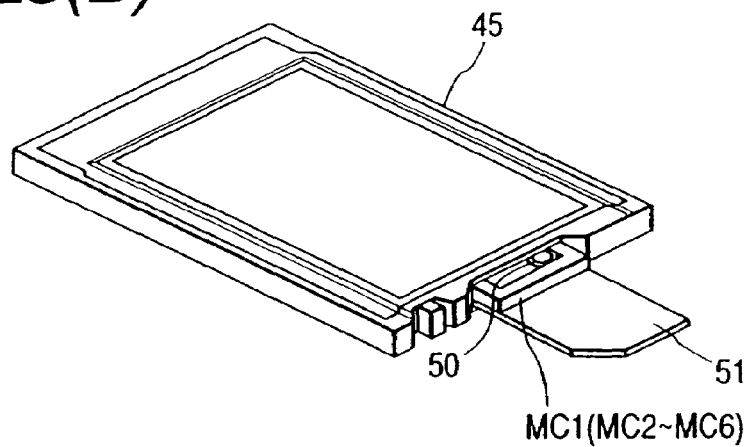
FIG. 25(B) is an explanatory view illustrating the operation of fitting of the memory card shown in FIG. 23 in the PC card adapter.
Figure 25C:
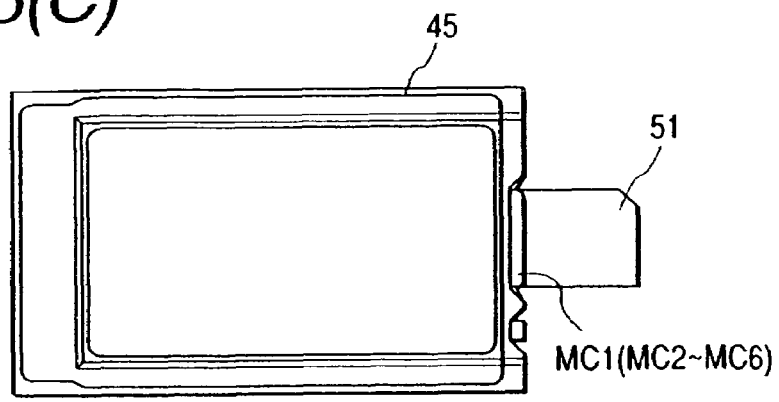
FIG. 25(C) is an explanatory view showing the operation of mounting of the memory card shown in FIG. 23 in the PC card adapter.

As shown in FIG. 25 by way of example, the memory card MC1 (corresponding to each of MC2 through MC6) can be loaded in its corresponding PC card adapter 45 even if the protective cover 51 remains attached to the memory card. If the loading of the memory card in the PC card adapter proceeds in order of the same FIGS. (A), (B) and (C), then the hollow rivet 50 is also inserted into the PC card adapter 45. However, if the head of the hollow rivet 50 is relatively thin, then the hollow rivet 50 no interferes with the loading of the memory card MC1 (corresponding to each of MC2 through MC6).

Incidentally, a seal is attached to the cavity portion or area of the memory card MC1 (corresponding to each of MC2 through MC6) so as to avoid the through hole 40 and hollow rivet 50 in each of FIGS. 20 through 25. A memory capacity or the like is printed on the seal. Since the formation of the through hole 40 and the seal attachment are carried out in other process steps, it is not necessary to perform mutual alignment of holes, etc.

States of the terminal surface of the memory card MC1 (corresponding to each of MC2 through MC6) are respectively illustrated by a (A) plan view, a (B) front view and a (C) side view in FIG. 26. A guide portion 62 formed by a slant surface or circular arc extending from a leading edge portion 60 extending at a front end in a memory card inserting direction to a terminal surface 61 of a casing 12 is formed in the memory card MC1 (corresponding to each of MC2 through MC6). The slant surface (so-called C processing surface) or circular arc (R processing surface) of the guide portion 62 is set larger than a slant surface or circular arc formed in each of other edge portions.

When the memory card MC1 (corresponding to each of MC2 through MC6) is inserted into its corresponding card socket, contacts of socket terminals 20A (corresponding to 21A and 22A) are brought into contact with the guide portion 62 of the memory card MC1 (corresponding to each of MC2 through MC6), which slowly guides the contacts into the terminal surface 61 without the contacts colliding with the leading end of the card impulsively. It is thus possible to prevent beforehand the possibility that the leading end of the casing 12 of the memory card MC1 (corresponding to each of MC2 through MC6) will deform and crack with time. There is no possibility that bending will occur in the socket terminal.

It is difficult to form the guide portion 62 on the card substrate 1 (corresponding to each of 1A through 1E) and easy to form it on the casing 12. Thus, the wall thickness of the casing must be left on the periphery of the card substrate 1 (corresponding to each of 1A through 1E) with a certain degree of width at the terminal surface 61. When, at this time, a diagonally-cut portion 63 used to represent the directionality of the card substrate as typified by FIG. 26 exists, it is considered that it is difficult to ensure the thick-walled portion. If the diagonally-cut portion 63 is formed as two-side cut portions 64 as shown in FIG. 27 by way of example in such a case, then the wall thickness of that portion of the casing 12 is easy to be ensured.

Figure 28:
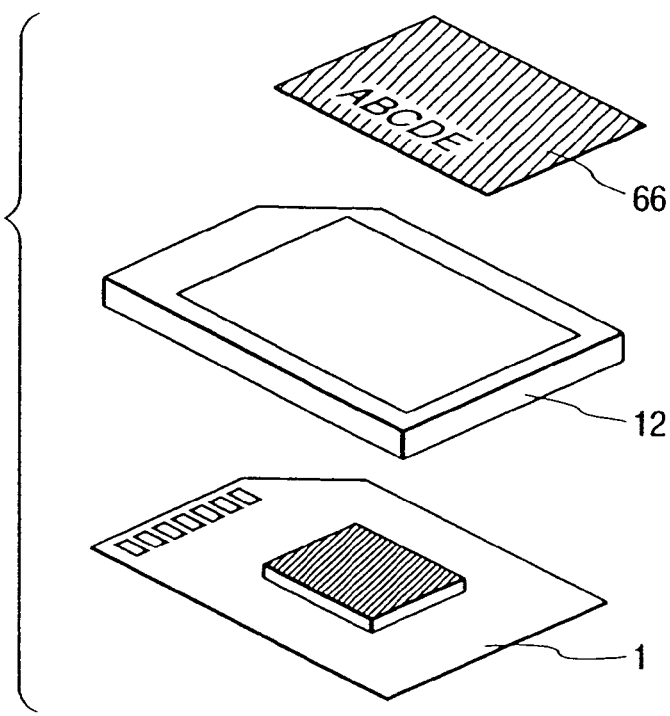
FIG. 28 is an exploded perspective view illustrating an example of a memory card in which a seal is put to represent attribute information of the memory card.
Figure 29:
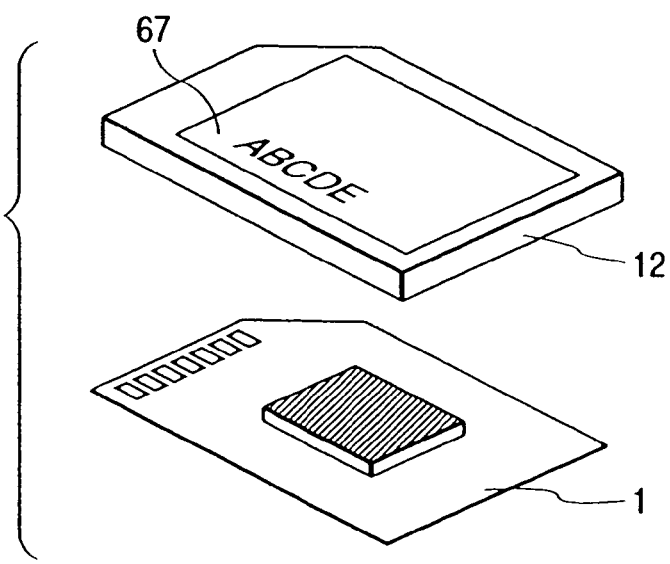
FIG. 29 is an exploded perspective view showing an example of a memory card in which attribute information of the memory card is represented by printing onto its casing.

In the memory card MC1 (corresponding to each of MC2 through MC6), its attribute information like storage capacity or the like is displayed. Such display of information may be done by applying a seal 66 onto a casing 12 as shown in FIG. 28 by way of example. When a reduction in the number of parts and the like are taken into consideration, required character information 67 may be printed on the surface of a casing 12 in advance as shown in FIG. 29 by way of example. Although not shown in particular, the character information 67 may be formed on the surface of the casing 12 as a concave portion in place of its printing. The printing or concavity-formation may be done before the assembly of the memory card. A needless stress can be avoided from being applied to each semiconductor chip.

An indication mark (e.g., triangular mark) 68 indicative of the direction of insertion of the memory card MC1 (corresponding to each of MC2 through MC6) into a card socket is concavely defined in the surface of the casing 12 in advance as shown in FIG. 30 by way of example. Although not shown in particular, the indication mark (e.g., triangular mark) 68 may be printed on the surface of the casing 12 in advance in place of the concavity formation. It is thus possible to reduce parts such as the seal having the indication mark, etc.

Since the memory card MC1 (corresponding to each of MC2 through MC6) is relatively small and thin as described above, it is difficult to take a space for adopting a mechanical slide function for the purpose of performing write protect. When the write protect is required under such circumstances, seal structures shown in FIGS. 31 and 32 by way of example, and lug structures shown in FIGS. 33 and 34 by way of example may be adopted.

FIG. 31 shows the state of release of write protect (rewritable state) by a seal system, and FIG. 32 illustrates the state of write protect by the seal system. In the respective drawings, (A) is a plan view and (B) is a cross-sectional view as seen in the direction indicated by arrows A-A of (A). In the seal system, a groove or trench 70 is defined in a casing 12, and the trench 70 is covered with a seal 71, whereby an unillustrated lever on the card socket side does not enter the trench 70. As a result, the state of release of write protect is detected. When it is desired to perform write protect, the seal may be detached from the trench 70 as shown in FIG. 32 by way example. If the seal is applied to it again, then write protect can be released.

In order to prevent an increase in step of the seal 71, only its area may be brought into cavity form, i.e., thin concave form to control or restrain the whole thickness of the casing although not clearly shown in the drawing.

FIG. 33 shows the state of release of write protect (rewritable state) by a lug system, and FIG. 34 illustrates the state of write protect by the lug system. In the respective drawings, (A) is a plan view and (B) is a cross-sectional view as seen in the direction indicated by arrows A-A of (A). In the lug system, a pair of cloven ends 73A and 73A, which extends through the front and back of a casing 12, is defined in one side of the casing 12 so as to be spaced away from each other. Cloven trenches or grooves 73B are defined in the front and back of the casing 12 so as to fall between the cloven ends 73A and 73A, whereby a snappable lug 73 is formed. When the lug 73 is in a non-broken state, an unillustrated lever on the card socket side is blocked by the lug 73 and thereby remains non-operated, whereby the state of release of write protect is detected. When it is desired to carry out write protect, the lug 73 is broken as shown in FIG. 34 by way of example to define a trench 74 in the casing 12. If the trench 74 is covered with a seal or the like, then write protect can be released again.

Figure 35:
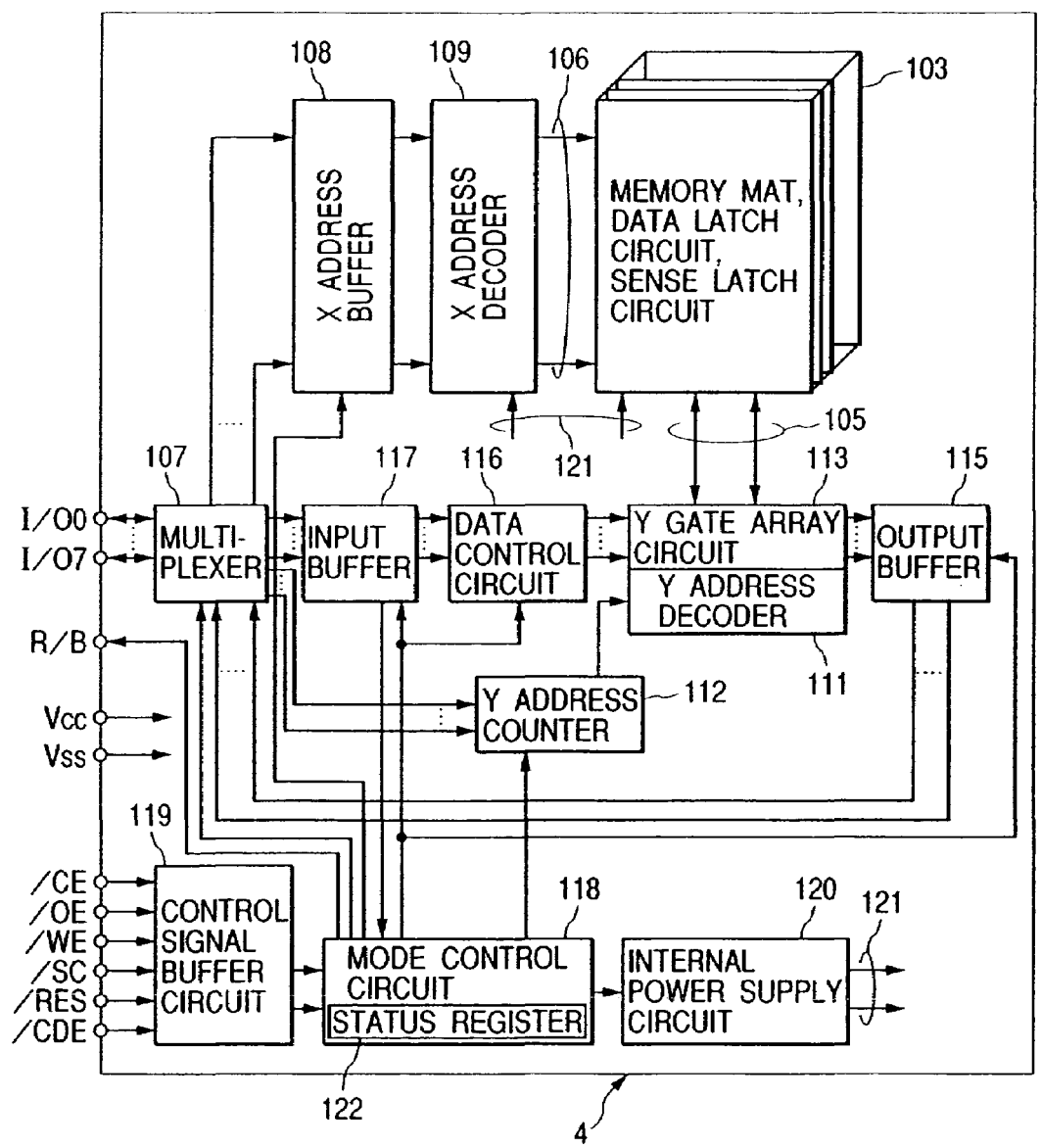
FIG. 35 is a block diagram showing a configuration of a flash memory chip as an example.
Figure 36:
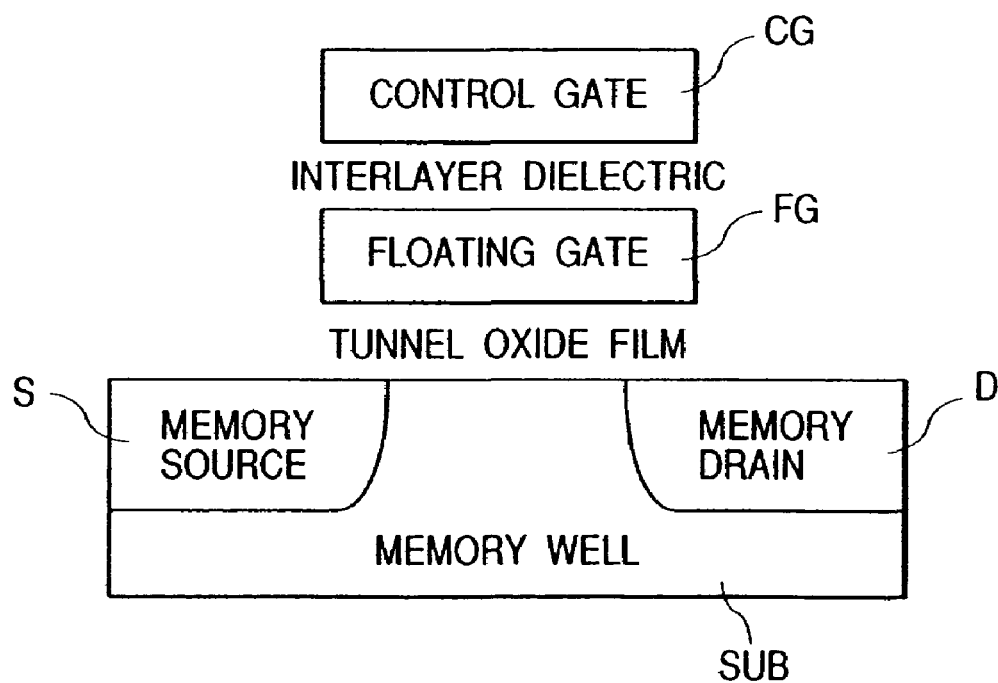
FIG. 36 is a cross-sectional view schematically depicting the structure of a non-volatile memory cell transistor for a flash memory chip.

The flash memory chip 4 will now be explained. FIG. 35 shows one example of the flash memory chip 4. In the same drawing, designated at numeral 103 is a memory array, which has memory mats, data latch circuits, and sense latch circuits. Each of the memory mats 103 has a large number of electrically erasable and writable non-volatile memory cell transistors. The memory cell transistor comprises a source S and drain D formed on a semiconductor substrate or a memory well SUB, a floating gate FG formed in a channel region through a tunnel oxide film, and a control gate CG superimposed on the floating gate with an interlayer dielectric interposed therebetween. The control gate CG is connected to its corresponding word line 106, the drain D is connected to its corresponding bit line 105, and the source S is connected to its corresponding unillustrated source line, respectively.

External input/output terminals I/O0 through I/O7 are shared for an address input terminal, a data input terminal, a data output terminal and a command input terminal. X address signals inputted from the external input/output terminals I/O0 through I/O7 are supplied to an X address buffer 108 through a multiplexer 107. An X address decoder 109 decodes internal complementary address signals outputted from the X address buffer 108 to drive their corresponding word lines.

The unillustrated sense latch circuit is provided on one end side of the bit lines 105, and similarly the unillustrated data latch circuit is provided on the other end side thereof. The corresponding bit line 105 is selected by a Y gate array circuit 113, based on a select signal outputted from a Y address decoder 111. Y address signals inputted from the external input/output terminals I/O0 through I/O7 are preset to a Y address counter 112. The address signals successively incremented with a preset value as a starting point are supplied to the Y address decoder 111.

The corresponding bit line selected by the Y gate array circuit 113 is made conductive to an input terminal of an output buffer 115 upon a data output operation. Upon a data input operation, the bit line is made conductive to an output terminal of an input buffer 117 through a data control circuit 116. Electrical connections between the output buffer 115, the input buffer 117 and the input/output terminals I/O0 through I/O7 are controlled by the multiplexer 107. Commands supplied from the input/output terminals I/O0 through I/O7 are supplied to a mode control circuit 118 through the multiplexer 107 and the input buffer 117. The data control circuit 116 is capable of supplying data about logical values placed under the control of the mode control circuit 118 to the corresponding memory array 103 in addition to data supplied from the input/output terminals I/O0 through I/O7.

A control signal buffer circuit 119 is supplied with the chip enable signal /CE, output enable signal /OE, write enable signal /WE, signal /SC for providing instructions for data latch timing, reset signal /RES, and command/data enable signal /CDE as access control signals. The mode control circuit 118 controls a signal interface function with the outside, etc. according to the state of these signals and controls internal operations according to command codes. When the commands or data are inputted to the input/output terminals I/O0 through I/O7, the signal /CDE is asserted. If the commands are inputted to the input/output terminals I/O0 through I/O7, then the signal /WE is further asserted. If the data are inputted to the input/output terminals I/O0 through I/O7, then the signal /WE is negated. If the addresses are inputted thereto, the signal /CDE is negated and the signal /WE is asserted. Thus, the mode control circuit 118 can distinguish between the commands, data and addresses inputted from the external input/output terminals I/O0 through I/O7 to the multiplexer. The mode control circuit 118 asserts a ready/busy signal R/B during erase and write operations and notifies its state to the outside.

An internal power supply circuit 120 generates various operating power supplies or voltages 121 for writing, erasing, verifying, reading, etc. and supplies them to the X address decoder 109 and the corresponding memory cell array 103.

The mode control circuit 118 controls the flash memory chip 4 over its entirety according to commands. The operation of the flash memory chip 4 is basically determined according to commands. The commands assigned to the flash memory chip include commands for reading, erasing, writing, etc.

The flash memory chip 4 has a status register 122 for the purpose of indicating its internal state. The contents thereof can be read from the input/output terminals I/O0 through I/O7 by asserting the signal /OE.

The invention made by the present inventors has been described specifically based on the embodiments. However, the present invention is not limited to the embodiments. It is needless to say that various changes can be made thereto within the scope not departing from the substance thereof.

The present invention can be applied to, for example, a memory card other than outline specifications of a multi media card, e.g., a memory having another standard, such as a compact flash memory or the like. Further, the present invention can be applied even to an IC card functioning as an interface card as well as to the memory card. Even in the case of the specifications of a small and thin IC card such as a multi media card or the like, the present invention can be applied to an interface card. A memory mounted to an IC card according to the present invention is not limited to a non-volatile memory and may be volatile memories (SRAM, DRAM, etc.). An IC card equipped with both a non-volatile memory and a volatile memory may be used. The flash memory chip may be a non-volatile memory chip or a mask ROM based on another storage format according to use applications of a memory card.

The above description has principally been made of the case in which the invention made by the present inventors has been applied to the memory card which falls within an application field serving as the background of the invention. However, the present invention is not limited to it and can be applied even to applications of IC cards such as a passbook, a credit card, an ID card, etc.

Advantageous effects obtained by typical ones of the inventions disclosed in the present application will be explained in brief as follows:

Namely, it is possible to improve serviceability and reliability of an IC card.

An IC card can be provided which is easy to implement an arrangement of connector terminals and compatibility related to functions.

An IC card can be implemented which is hard to cause a power-to-power short when it is loaded in a card socket.

A high-reliability IC card can be provided which is capable of avoiding the compacting of wiring patterns and that of bonding wires and provides high speed and high performance.

An IC card can be implemented which is capable of blocking the inflow of surges from each connector terminal by a simple configuration.

What is claimed is:

1. A memory card comprising
a substrate;
a first flash memory chip mounted over said substrate;
a controller chip for said first flash memory chip mounted over said substrate;
a plurality of external terminals arranged over said substrate; and
a mold resin covering said first flash memory chip and said controller chip;
wherein said external terminals are arranged in first and second sequences,
wherein the terminals of said first sequence are shifted from the terminals of said second sequence in a first direction along which said external terminals are arranged,
wherein, in a second direction perpendicular to said first direction, said terminals of said second sequence include terminals arranged behind regions between pairs of adjacent terminals of said first sequence,
wherein the terminals of said first sequence include a source voltage supply terminal, and
wherein said second sequence has no terminals arranged behind regions between said source voltage supply terminal and terminals of said first sequence adjacent to said source voltage supply terminal.

2. A memory card according to claim 1,
wherein, in said second direction, external terminals at each end of said second sequence extend to regions adjoining external terminals at each end of said first sequence.

3. A memory card according to claim 1,
wherein said external terminals include data terminals corresponding to eight bits and are provided as thirteen in total.

4. A memory card according to claim 1,
wherein said external terminals include two ground voltage supply terminals, and one clock signal input terminal.

5. A memory card according to claim 1,
wherein a planar size of said memory card is set to 24 mm×32 mm.

6. A memory card according to claim 1,
wherein a thickness of said memory card is set to 1.4 mm.

7. A memory card according to claim 1,
wherein said first flash memory chip is of larger size than said controller chip.

8. A memory card according to claim 1, further comprising:
a second flash memory chip, and
wherein said mold resin covers said controller chip, said first flash memory chip and second flash memory chip.

9. A memory card according to claim 8,
wherein said second flash memory chip is mounted over said first flash memory chip.

10. A memory card according to claim 1,
wherein said mold resin includes epoxy-based resin.

11. A memory card comprising:
a substrate;
a first flash memory chip mounted over said substrate;
a controller chip for said first flash memory chip mounted over said substrate;
a plurality of external terminals arranged over said substrate; and a mold resin covering said first flash memory chip and said controller chip;

wherein said external terminals are arranged in first and second sequences, wherein the terminals of said first sequence are shifted from the terminals of said second sequence in a first direction along which said external terminals are arranged, wherein, in a second direction perpendicular to said first direction, said terminals of said second sequence include terminals arranged behind regions between pairs of adjacent terminals of said first sequence, wherein the terminals of said first sequence include a source voltage supply terminal, and wherein said second sequence has no terminals arranged behind a region which extends between terminals of said first sequence adjacent to said source voltage supply terminal and in which said source voltage supply terminal is located.

12. A memory card according to claim 11,
wherein, in said second direction, external terminals at each end of said second sequence extend to regions adjoining external terminals at each end of said first sequence.

13. A memory card according to claim 11,
wherein said external terminals include data terminals corresponding to eight bits and are provided as thirteen in total.

14. A memory card according to claim 11,
wherein said external terminals include two ground voltage supply terminals, and one clock signal input terminal.

15. A memory card according to claim 11,
wherein a planar size of said memory card is set to 24 mm×32 mm.

16. A memory card according to claim 11,
wherein a thickness of said memory card is set to 1.4 mm.

17. A memory card according to claim 11,
wherein said first flash memory chip is of larger size than said controller chip.

18. A memory card according to claim 11, further comprising:
a second flash memory chip, and
wherein said mold resin covers said controller chip, said first flash memory chip and second flash memory chip.

19. A memory card according to claim 18,
wherein said second flash memory chip is mounted over said first flash memory chip.

20. A memory card according to claim 11,
wherein said mold resin includes epoxy-based resin.

* * * * *